(12) United States Patent
Check

(10) Patent No.: US 11,031,527 B2
(45) Date of Patent: Jun. 8, 2021

(54) REFLECTIVE LAYERS FOR LIGHT-EMITTING DIODES

(71) Applicant: Cree, Inc., Durham, NC (US)

(72) Inventor: Michael Check, Apex, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 15/882,103

(22) Filed: Jan. 29, 2018

(65) Prior Publication Data

US 2019/0237630 A1 Aug. 1, 2019

(51) Int. Cl.
| | |
|---|---|
| *H01L 33/46* | (2010.01) |
| *H01L 33/38* | (2010.01) |
| *H01L 33/42* | (2010.01) |
| *H01L 33/32* | (2010.01) |
| *H01L 33/44* | (2010.01) |
| *H01L 33/60* | (2010.01) |
| *H01L 33/14* | (2010.01) |
| *H01L 33/22* | (2010.01) |
| *H01L 33/08* | (2010.01) |

(52) U.S. Cl.
CPC ............ *H01L 33/46* (2013.01); *H01L 33/382* (2013.01); *H01L 33/42* (2013.01); *H01L 33/08* (2013.01); *H01L 33/14* (2013.01); *H01L 33/22* (2013.01); *H01L 33/32* (2013.01); *H01L 33/44* (2013.01); *H01L 33/60* (2013.01)

(58) Field of Classification Search
CPC ....... H01L 33/10; H01L 27/153; H01L 33/06; H01L 33/504; H01L 33/385; H01L 33/60; H01L 25/0756; H01L 33/46
See application file for complete search history.

(56) References Cited

U.S. PATENT DOCUMENTS

| 5,739,554 A | 4/1998 | Edmond et al. |
| 6,657,236 B1 | 12/2003 | Thibeault et al. |
| | (Continued) | |

FOREIGN PATENT DOCUMENTS

| CN | 104037277 A | 9/2014 |
| CN | 107452846 A | 12/2017 |
| | (Continued) | |

OTHER PUBLICATIONS

Zhao, S. et al., "Enhanced luminous efficiency of phosphor-converted LEDs by using back reflector to increase reflectivity for yellow light," Applied Optics, vol. 53, No. 34, Dec. 1, 2014, Optical Society of America, pp. 8104-8110.

(Continued)

*Primary Examiner* — Hoang-Quan Ho
(74) *Attorney, Agent, or Firm* — Withrow & Terranova, P.L.L.C.

(57) ABSTRACT

A light-emitting diode (LED) chip with reflective layers having high reflectivity. The LED chip may include an active LED structure including an active layer between an n-type layer and a p-type layer. A first reflective layer is adjacent the active LED structure and comprises a plurality of dielectric layers with varying optical thicknesses. The plurality of dielectric layers may include a plurality of first dielectric layers and a plurality of second dielectric layers of varying thicknesses and compositions. The LED chip may further include a second reflective layer that includes an electrically conductive path through the first reflective layer.

32 Claims, 18 Drawing Sheets

(56) References Cited

U.S. PATENT DOCUMENTS

| | | |
|---|---|---|
| 6,747,298 B2 | 6/2004 | Slater, Jr. et al. |
| 6,784,462 B2 | 8/2004 | Schubert |
| 6,791,119 B2 | 9/2004 | Slater, Jr. et al. |
| 6,821,804 B2 | 11/2004 | Thibeault et al. |
| 6,888,167 B2 | 5/2005 | Slater, Jr. et al. |
| 7,211,803 B1 | 5/2007 | Dhurjaty et al. |
| 7,326,967 B2 | 2/2008 | Hsieh et al. |
| 7,622,746 B1 | 11/2009 | Lester et al. |
| 7,829,906 B2 | 11/2010 | Donofrio |
| 7,880,181 B2 | 2/2011 | Yoon et al. |
| 7,915,629 B2 | 3/2011 | Li et al. |
| 8,017,963 B2 | 9/2011 | Donofrio et al. |
| 8,212,273 B2 | 7/2012 | McKenzie et al. |
| 8,368,100 B2 | 2/2013 | Donofrio et al. |
| 8,471,280 B2 | 6/2013 | Aldaz et al. |
| D691,973 S | 10/2013 | Donofrio et al. |
| 8,575,633 B2 | 11/2013 | Donofrio et al. |
| 8,598,609 B2 | 12/2013 | Ibbetson et al. |
| 8,643,039 B2 | 2/2014 | Donofrio et al. |
| 8,680,556 B2 | 3/2014 | Ibbetson et al. |
| 8,710,536 B2 | 4/2014 | Ibbetson et al. |
| 8,866,169 B2 | 10/2014 | Emerson et al. |
| 8,940,561 B2 | 1/2015 | Donofrio et al. |
| 9,000,470 B2 | 4/2015 | Tudorica et al. |
| 9,070,850 B2 | 6/2015 | Keller et al. |
| 9,362,459 B2 | 6/2016 | Heikman et al. |
| 9,412,907 B1 | 8/2016 | Place et al. |
| 9,461,201 B2 | 10/2016 | Heikman et al. |
| 9,887,327 B2 | 2/2018 | Reiherzer et al. |
| 10,236,414 B2 * | 3/2019 | Lee .............. H01L 33/06 |
| 2003/0025212 A1 | 2/2003 | Bhat et al. |
| 2003/0230754 A1 | 12/2003 | Steigerwald et al. |
| 2005/0255619 A1 | 11/2005 | Negro et al. |
| 2005/0274956 A1 | 12/2005 | Bhat |
| 2008/0179611 A1 | 7/2008 | Chitnis et al. |
| 2008/0246047 A1 | 10/2008 | Hsu et al. |
| 2009/0146165 A1 | 6/2009 | Hasnain et al. |
| 2009/0283787 A1 | 11/2009 | Donofrio et al. |
| 2010/0140635 A1 | 6/2010 | Ibbetson et al. |
| 2011/0305021 A1 | 12/2011 | Xin |
| 2012/0049219 A1 | 3/2012 | Kamiya et al. |
| 2012/0049756 A1 | 3/2012 | Schubert |
| 2012/0074441 A1 | 3/2012 | Seo et al. |
| 2012/0193660 A1 | 8/2012 | Donofrio et al. |
| 2012/0193662 A1 | 8/2012 | Donofrio et al. |
| 2012/0280263 A1 * | 11/2012 | Ibbetson ............ G02B 19/0061 257/98 |
| 2012/0326159 A1 | 12/2012 | Bergmann et al. |
| 2013/0058102 A1 | 3/2013 | Lin |
| 2013/0141920 A1 | 6/2013 | Emerson et al. |
| 2013/0264592 A1 | 10/2013 | Bergmann et al. |
| 2013/0328096 A1 | 12/2013 | Donofrio et al. |
| 2013/0341634 A1 | 12/2013 | Heikman et al. |
| 2014/0070245 A1 * | 3/2014 | Haberern .............. H01L 33/08 257/93 |
| 2014/0203320 A1 | 7/2014 | Ibbetson et al. |
| 2015/0140710 A1 | 5/2015 | McLaurin et al. |
| 2015/0179879 A1 | 6/2015 | Yang et al. |
| 2015/0179903 A1 | 6/2015 | Pun et al. |
| 2015/0295138 A1 | 10/2015 | Chae et al. |
| 2015/0380621 A1 | 12/2015 | Chae et al. |
| 2016/0155901 A1 | 6/2016 | Lopez et al. |
| 2016/0211420 A1 | 7/2016 | Donofrio et al. |
| 2016/0260869 A1 | 9/2016 | Jeon et al. |
| 2017/0012175 A1 | 1/2017 | Wang et al. |
| 2017/0084787 A1 | 3/2017 | Emura et al. |
| 2017/0098746 A1 * | 4/2017 | Bergmann ............ H01L 33/10 |
| 2017/0108173 A1 * | 4/2017 | Kim .............. H01L 33/32 |
| 2017/0149211 A1 * | 5/2017 | Jeong ................. G02B 5/0833 |
| 2017/0210277 A1 | 7/2017 | Harada et al. |
| 2017/0294417 A1 | 10/2017 | Edmond et al. |
| 2017/0294418 A1 * | 10/2017 | Edmond ............ H01L 27/156 |
| 2017/0331009 A1 * | 11/2017 | Shioji ................. H01L 33/46 |
| 2018/0114878 A1 | 4/2018 | Danesh et al. |
| 2018/0254386 A1 | 9/2018 | Perzlmaier et al. |
| 2019/0051805 A1 | 2/2019 | Oh et al. |

FOREIGN PATENT DOCUMENTS

| | | |
|---|---|---|
| CN | 107546303 A | 1/2018 |
| WO | 2012086483 A1 | 6/2012 |

OTHER PUBLICATIONS

Zhao, Y.S. et al., "Efficiency Enhancement of InGaN/GaN Light-Emitting Diodes with a Back-Surface Distributed Bragg Reflector," Journal of Electronic Materials, vol. 32, No. 12, 2003, Springer-Verlag, pp. 1523-1526.

Examination Report for European Patent Application No. 16778642.5, dated Apr. 26, 2019, 5 pages.

International Search Report and Written Opinion for International Patent Application No. PCT/US2019/015418, dated May 14, 2019, 19 pages.

Non-Final Office Action and Examiner-Initiated Interview Summary for U.S. Appl. No. 15/280,438, dated May 3, 2019, 23 pages.

Author Unknown, "Cree® XLamp® XB-D and XT-E LED Optical Design Considerations," Application Note, CLD-AP104 Rev 0B, www.cree.com/Xlamp, 2014, Cree, Inc., pp. 1-15.

Carey, Julian, "New LED architectures and phosphor technologies lower costs and boost quality," (Magazine), LED Design & Manufacturing, vol. 11, Issue 7, Sep. 4, 2014, Tulsa, OK, PennWell Corporation, pp. 1-16.

Kim, Jong Kyu et al., "GaInN light-emitting diodes with $RuO_2$/$SiO_2$/Ag omni-directional reflector," Applied Physics Letters, vol. 84, Issue 22, May 31, 2004, American Institute of Physics, pp. 4508-4510.

Palik, E. D., ed., "Handbook of Optical Constants of Solids: Volume One," Academic Press, 1985, 785 pages.

Wright, Maury, "Strategies in Light to span SSL technology and business domains," (Magazine), SSL Design, vol. 12, Issue 2, Feb. 16, 2015, Tulsa, OK, PennWell Corporation, pp. 1-22.

Non-Final Office Action for U.S. Appl. No. 15/280,438, dated May 8, 2018, 26 pages.

International Search Report and Written Opinion for International Patent Application No. PCT/US2016/054372, dated Dec. 19, 2016, 16 pages.

International Preliminary Report on Patentability for International Patent Application No. PCT/US2016/054372, dated Apr. 3, 2018, 9 pages.

Final Office Action for U.S. Appl. No. 15/280,438, dated Nov. 1, 2018, 26 pages.

Advisory Action, Interview Summary, and AFCP 2.0 Decision for U.S. Appl. No. 15/280,438, dated Dec. 13, 2018, 7 pages.

Bruschi, Lorenzo et al., "Adsorption in alumina pores open at one and at both ends," Nanoscale, vol. 7, Issue 6, Feb. 14, 2015, Royal Society of Chemistry, pp. 2587-2596.

Bruschi, Lorenzo et al., "Supporting Information: Adsorption in alumina pores open at one and at both ends," Electronic Supplementary Material (ESI) for Nanoscale, 2014, http://www.rsc.org/suppdata/nr/c4/c4nr06469k/c4nr06469k1.pdf, Royal Society of Chemistry, 3 pages.

U.S. Appl. No. 15/280,438, filed Sep. 29, 2016.

Advisory Action, Interview Summary, and AFCP 2.0 Decision for U.S. Appl. No. 15/280,438, dated Nov. 27, 2019, 6 pages.

Final Office Action and Examiner-Initiated Interview Summary for U.S. Appl. No. 15/280,438, dated Sep. 13, 2019, 23 pages.

Notification of First Office Action for Chinese Patent Application No. 201680070374.8, dated Feb. 6, 2020, 13 pages.

Intention to Grant for European Patent Application No. 16778642.5, dated Feb. 27, 2020, 93 pages.

International Search Report and Written Opinion for International Patent Application No. PCT/US2019/059331, dated Jan. 27, 2020, 19 pages.

Non-Final Office Action for U.S. Appl. No. 15/280,438, dated Jan. 22, 2020, 17 pages.

(56) References Cited

OTHER PUBLICATIONS

Non-Final Office Action for U.S. Appl. No. 16/222,173, dated Feb. 14, 2020, 13 pages.
Non-Final Office Action and Examiner-Initiated Interview Summary for U.S. Appl. No. 15/280,438, dated Jul. 7, 2020, 22 pages.
International Preliminary Report on Patentability for International Patent Application No. PCT/US2019/015418, dated Aug. 13, 2020, 12 pages.
Notice of Allowance for U.S. Appl. No. 16/222,173, dated May 29, 2020, 10 pages.
Non-Final Office Action for U.S. Appl. No. 16/357,949, dated Jun. 10, 2020, 10 pages.
Final Office Action for U.S. Appl. No. 16/357,949, dated Sep. 30, 2020, 9 pages.
Notification of the Second Office Action for Chinese Patent Application No. 201680070374.8, dated Sep. 25, 2020, 15 pages.
Notice of Allowance for U.S. Appl. No. 15/280,438, dated Dec. 23, 2020, 9 pages.
Notice of Allowance for U.S. Appl. No. 16/357,949, dated Dec. 24, 2020, 8 pages.
Non-Final Office Action for U.S. Appl. No. 16/542,458, dated Nov. 23, 2020, 9 pages.
Notice of Allowance for U.S. Appl. No. 16/542,458, dated Apr. 19, 2021, 8 pages.

* cited by examiner under consideration. The average reflectivity 46 is about 96% for viewing angles from 0 to 50 degrees and thereafter drops until it reaches about 60% at a viewing angle of about 85 degrees.

REFLECTIVE LAYERS FOR LIGHT-EMITTING DIODES

FIELD OF THE DISCLOSURE

The present disclosure relates to solid-state lighting devices including light-emitting diodes and more particularly to light-emitting diodes with reflective layers having high reflectivity.

BACKGROUND

Solid-state lighting devices such as light-emitting diodes (LEDs) are increasingly used in both consumer and commercial applications.

Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

To increase the opportunity for photons to exit an LED, it has been found useful to pattern, roughen, or otherwise texture the interface between an LED surface and the surrounding environment to provide a varying surface that increases the probability of refraction over internal reflection and thus enhances light extraction. Despite the availability of such methods, their practical employment has been limited in at least certain contexts. For example, mechanical methods may introduce stress in or cause breakage of LED material and may also be limited in terms of the position in a fabrication sequence in which they can be employed. Chemical (e.g., photolithographic etching) methods may also be limited in terms of their position in a fabrication sequence to avoid misalignment or microfeature damage during subsequent LED chip fabrication and/or to avoid chemical incompatibility with LED chip layers if etching is performed after chip fabrication.

Another way to increase light extraction efficiency is to provide reflective surfaces that reflect generated light so that such light may contribute to useful emission from an LED chip. In a typical LED package 10 illustrated in FIG. 1, a single LED chip 12 is mounted on a reflective cup 13 by means of a solder bond or conductive epoxy. One or more wire bonds 11 can connect the ohmic contacts of the LED chip 12 to leads 15A and/or 15B, which may be attached to or integral with the reflective cup 13. The reflective cup may be filled with an encapsulant material 16, which may contain a wavelength conversion material such as a phosphor. At least some of light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected. Some light may be absorbed by the reflector cup due to the less than 100% reflectivity of practical reflector surfaces. Some metals can have less than 95% reflectivity in the wavelength range of interest.

FIG. 2 shows another LED package in which one or more LED chips 22 can be mounted onto a carrier such as a printed circuit board (PCB) carrier, substrate, or submount 23. A metal reflector 24 mounted on the submount surrounds the LED chips 22 and reflects light emitted by the LED chips 22 away from the package 20. The reflector 24 also provides mechanical protection to the LED chips 22. One or more wire bond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond. The metal reflector 24 may also experience optical losses when the light is reflected because it also has less than 100% reflectivity.

The reflectors shown in FIGS. 1 and 2 are arranged to reflect light that escapes from the LED. LEDs have also been developed that have internal reflective surfaces or layers to reflect light internal to the LEDs. FIG. 3 shows a schematic of an LED chip 30 with an LED 32 mounted on a submount 34 by a metal bond layer 36. The LED further comprises a p-contact/reflector 38 between the LED 32 and the metal bond 36, with the p-contact/reflector 38 typically comprising a metal such as silver (Ag). This arrangement is utilized in commercially available LEDs such as those from Cree® Inc., available within the EZBright™ family of LEDs. The p-contact/reflector 38 can reflect light emitted from the LED chip's active region toward the submount back toward the LED's primary emitting surface. The reflector also reflects total internal reflection light back toward the LED's primary emitting surface. Like the metal reflectors above, the p-contact/reflector 38 reflects less than 100% of light and in some cases less than 95%.

FIG. 4 shows a graph 40 showing the reflectivity of silver on gallium nitride (GaN) at different viewing angles for light with a wavelength of 460 nm. The refractive index of GaN about 2.4, while the complex refractive index for silver is taken from the technical literature. [See Handbook of Optical Constants of Solids, edited by E. Palik.] The graph shows the p-polarization reflectivity 42, s-polarization reflectivity 44, and average reflectivity 46, with the average reflectivity 46 generally illustrating the overall reflectivity of the metal for the purpose of LEDs where light is generated with random polarization. The reflectivity at 0 degrees is lower than the reflectivity at 90 degrees, and this difference can result in up to 5% or more of the light being lost on each reflection. In an LED chip, in some instances total internal reflection light can reflect off the mirror several times before it escapes and, as a result, small changes in the mirror absorption can lead to significant changes in the brightness of the LED. The cumulative effect of the mirror absorption on each reflection can reduce the light intensity such that less than 75% of light from the LED's active region actually escapes as LED light.

The art continues to seek improved light-emitting diodes and solid-state lighting devices having reduced optical losses and providing desirable illumination characteristics capable of overcoming challenges associated with conventional lighting devices.

SUMMARY

The present disclosure relates to solid-state lighting devices including light-emitting diodes and more particularly to light-emitting diodes with reflective layers having high reflectivity.

In some embodiments, a light-emitting diode (LED) chip includes an active LED structure comprising an active layer between an n-type layer and a p-type layer and a first reflective layer adjacent the active LED structure and comprising a plurality of dielectric layers. The LED chip includes a second reflective layer on the first reflective layer, a barrier layer on the second reflective layer, and a passivation layer on the barrier layer. In some embodiments, each dielectric layer of the plurality of dielectric layers comprises a different thickness. In some embodiments, the plurality of dielectric layers comprises a plurality of first dielectric layers and a plurality of second dielectric layers. In some embodiments, the plurality of dielectric layers comprises an aperiodic Bragg reflector. In some embodiments, the second reflective layer includes an electrically conductive path through the first dielectric layer.

In other embodiments, a light-emitting diode (LED) chip includes an active LED structure including an active layer between an n-type layer and a p-type layer, and a first reflective layer adjacent the active LED structure and including a plurality of first dielectric layers and a plurality of second dielectric layers wherein each layer of the plurality of first dielectric layers includes a different thickness. The thickest layer of the plurality of first dielectric layers is between other layers of the plurality of first dielectric layers.

In other embodiments, a light-emitting diode (LED) chip includes an active LED structure including an active layer between an n-type layer and a p-type layer and a first reflective layer adjacent the active LED structure and including a plurality of first dielectric layers and a plurality of second dielectric layers. An average thickness of the plurality of first dielectric layers is greater than an average thickness of the plurality second dielectric layers and at least one layer of the plurality of second dielectric layers comprises a thickness greater than at least one layer of the plurality of first dielectric layers.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
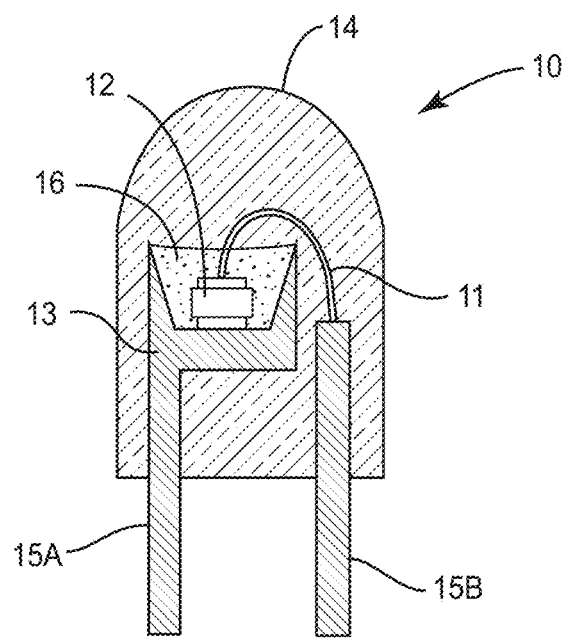
FIG. 1 is a cross-sectional representation of a conventional light-emitting diode (LED).
Figure 2:
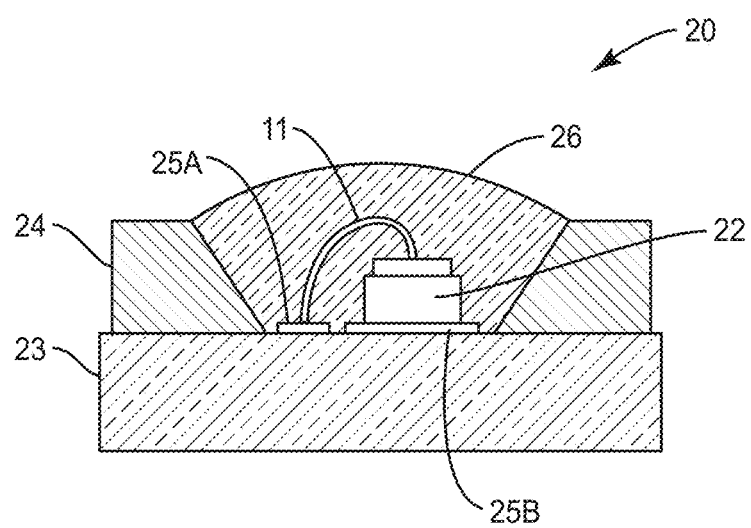
FIG. 2 is a cross-sectional representation of a conventional LED.
Figure 3:
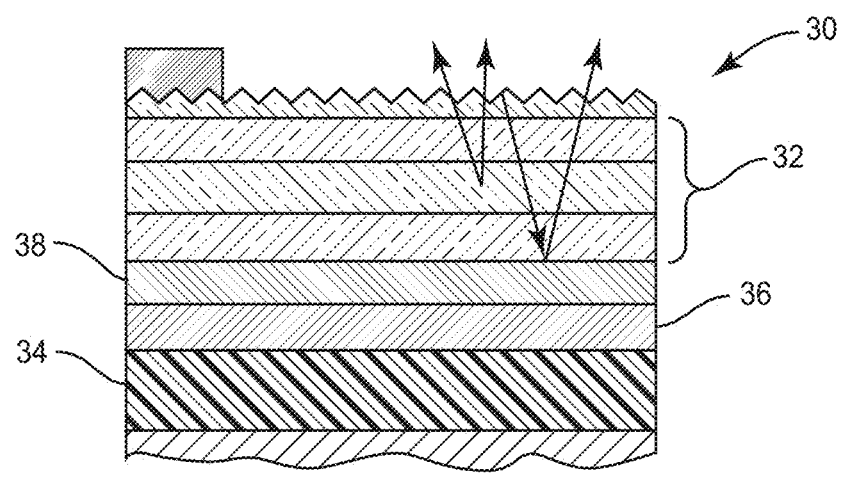
FIG. 3 is a partial cross-sectional representation of a conventional LED.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure is directed to solid-state emitters having internal or integral reflective surfaces/layers arranged to increase the emission efficiency of the emitters. The present disclosure is described herein with reference to light-emitting diodes (LEDs), but it is understood that it is equally applicable to other solid-state emitters. Devices of the present disclosure can be used as a reflector in conjunction with one or more contacts or can be used as a reflector separate from the contacts.

As described above, different embodiments of LED chips according to the present disclosure comprise an active LED structure having an active layer between two oppositely doped layers. It is understood that the active LED structure may include many additional layers, and the active layer may include a plurality of layers, and two oppositely doped layers may also include a plurality of layers. A first reflective layer can be provided adjacent to one of the oppositely doped layers, with the first layer comprising a material with a different index of refraction from the active LED structure. In some embodiments, the first reflective layer can comprise a layer with an index of refraction that is primarily lower at or near its interface with the active LED structure. Stated differently, when the layer comprises a number of materials, some embodiments of the layer can have an average index of refraction lower than that of the active LED structure. In still other embodiments, the portion of the reflective layer closest to the active LED structure should be less than that of the active LED structure.

The difference in index of refraction between the active LED structure and the first reflective layer increases the amount of total internal reflection (TIR) light at this interface. In embodiments in which the first reflective layer has an index of refraction lower than that of the active LED structure, the lower index of refraction material provides a step down in the index of refraction that increases the amount of light that can experience TIR. Some embodiments of LED chips according to the present disclosure can also comprise a second reflective layer or metal layer that can be on and used in conjunction with the first reflective layer such that light passing through the first reflective layer (e.g., not experiencing TIR) can be reflected by the second reflective layer.

These internal or integral reflective layers can reduce optical emission losses that can occur by light being emitted in an undesirable direction where it can be absorbed. Light that is emitted from the emitter's active LED structure in a direction away from useful light emission, such as toward the substrate, submount, or metal bonding layers, can instead be reflected by the first reflective layer. The reflective surfaces can be positioned to reflect this light so that it emits from the LED chip in a desirable direction. Embodiments of the present disclosure provide one or a plurality of layers and materials that can cooperate to efficiently reflect light in the desired directions so that it can contribute to the emitter's useful emission.

The first reflective layer can comprise many different materials including silicon nitride (SiN, SiNx, $Si_3N_4$), silicon (Si), germanium (Ge), silicon oxide ($SiO_2$, SiOx), titanium oxide ($TiO_2$), indium tin oxide (ITO), magnesium oxide (MgOx), zinc oxide (ZnO), and combinations thereof. In some embodiments, the first reflective layer comprises dielectric materials such as silicon dioxide ($SiO_2$) and/or silicon nitride (SiN, $Si_3N_4$). It is understood that many other materials can be used with refractive indexes that are lower or higher, with some material having an index of refraction that is up to approximately 50% smaller than that of the LED's active structure material. In other embodiments the index of refraction of the first reflective material can be up to approximately 40% smaller than that of the active structure material, while in other embodiments it can be up to approximately 30% smaller, while in still other embodiments it can be up to approximately 20% smaller. For example, in some embodiments the GaN material of the active structure has an index of refraction of about 2.4, and the reflective material includes one or more layers of silicon dioxide material with an index of refraction of about 1.46 and one or more layers of silicon nitride with an index of refraction of about 1.9.

Many conventional LEDs rely primarily on a metal reflector layer made of different material such as silver (Ag), Ag alloys, gold (Au), and Au alloys. As described above, there can be losses with each reflection off metal reflectors, and these losses can be significant, particularly for light making multiple passes and reflections in the LED. There are no optical losses in light reflected by TIR, so that when more light is reflected using TIR, the emission efficiency of the LED can increase. Other conventional LEDs chips have relied on internal multiple layer reflectors, such as distributed Bragg reflectors (DBRs). A conventional DBR, such as a quarter-wave reflector, includes multiple pairs of layers with different indexes of refraction. The multiple pairs are arranged sequentially to provide multiple interfaces with index of refraction gradients. Each interface between the two layers contributes a Fresnel reflection; however, this occurs only for a particular angle of incidence range.

Different embodiments of emitters according to the present disclosure can also utilize other structures, layers, or features that allow for efficient and reliable LED operation. In some embodiments, a current-spreading layer can be included in proximity to the reflective layer to provide for spreading of current into the one or more layers of the active LED structure. In other embodiments, materials can be included to provide for reliable adhesion between different layers, such as between the low index of refraction layer and the metal reflective layer. Different embodiments of the disclosure also provide having conductive via or path arrangements that provide conductive paths through the low index of refraction reflective layer. This allows an electric signal to pass through the low index of refraction layer along the vias so that the composite layer can be used as an internal layer, where an electrical signal can pass through the low index of refraction layer during operation. This via arrangement can take many different shapes and sizes as described in detail below.

The present disclosure is described herein with reference to certain embodiments, but it is understood that the disclosure can be embodied in many different forms and should not be construed as limited to the embodiments set forth herein. In particular, the lower index of refraction first reflective layer can comprise many different material layers and can have many different thicknesses beyond those described herein. Some embodiments can have layers having layers or materials with an index of refraction higher than that of the active LED structure, but these layers can be thin enough to have minimal optical impact. The first reflective layer can also be in many different locations on different solid-state emitters beyond those described herein and can be used on different devices beyond solid-state emitters. Further, the first reflective layer can be provided with or without conductive structures to allow electrical signals to pass through. It is understood that LEDs according to the present disclosure can also utilize the first reflective layer in conjunction with other reflectors including metal and other dielectric reflective layers. The first reflective layer is arranged to increase the amount of light reflected by TIR while at the same time maintaining a simple, efficient, and cost-effective reflecting system.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

Figure 5A:
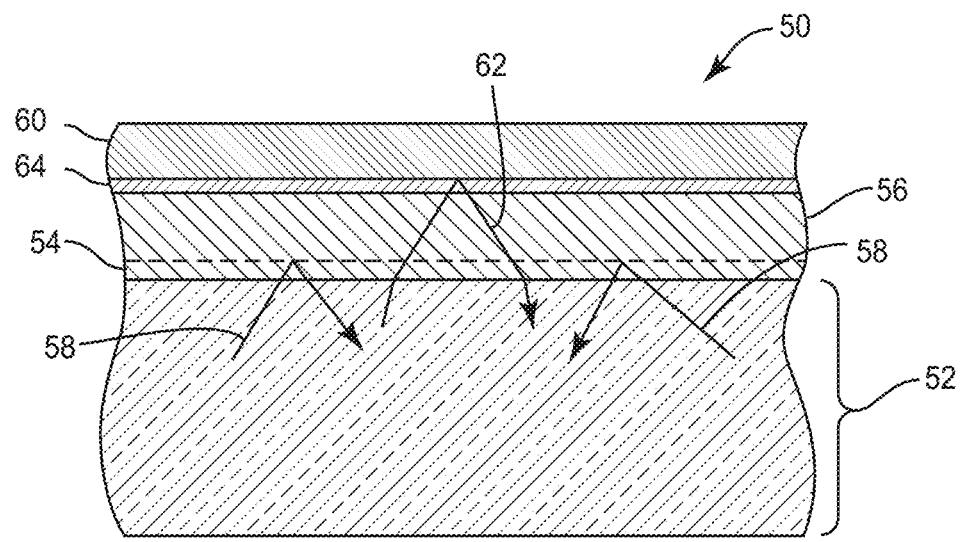
FIG. 5A is a partial cross-sectional representation of an LED according to some embodiments.

FIG. 5A illustrates a sectional view of an LED chip 50 according to some embodiments. The LED chip 50 includes reflective structures that allow for LED chip operation with increased emission efficiency. Although the present disclosure is described with reference to fabrication of a single LED chip, it is understood that the present disclosure can also be applied to wafer-level LED chip fabrication, fabrication of groups of LED chips, or fabrication of packaged LED chips. The wafer LEDs or groups of LEDs can then be separated into individual LED chips using known singulation or dicing methods. The present disclosure can also be used in different LEDs having different geometries, such lateral geometry or vertical geometry. The present disclosure can also be used in LEDs compatible with flip-chip mounting and in those that are arranged for non-flip-chip mounting.

The LED chip 50 comprises an active LED structure 52 or region that can have many different semiconductor layers arranged in different ways. The fabrication and operation of LEDs and their active structure are generally known in the art and are only briefly discussed herein. The layers of the active LED structure 52 can be fabricated using known processes with a suitable process being fabrication using metal organic chemical vapor deposition. The layers of the active LED structure 52 can comprise many different layers and generally comprise an active layer sandwiched between n-type and p-type oppositely doped epitaxial layers, all of which are formed successively on a growth substrate. It is understood that additional layers and elements can also be included in the active LED structure 52, including but not limited to, buffer layers; nucleation layers; super lattice structures; un-doped layers; cladding layers; contact layers; and current-spreading layers and light extraction layers and elements. The active layer can comprise single quantum well, multiple quantum well, double heterostructure, or super lattice structures.

The active LED structure 52 can be fabricated from different material systems, with some material systems being Group III nitride-based material systems. Group III nitrides refer to those semiconductor compounds formed between nitrogen and the elements in the Group III of the periodic table, usually aluminum (Al), gallium (Ga), and indium (In). Gallium nitride (GaN) is a common binary compound. The term also refers to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide, organic semiconductor materials, and other Group III-V systems such as gallium phosphide, gallium arsenide, and related compounds.

The active LED structure 52 may be grown on a growth substrate (not shown in FIG. 5). Growth substrates can be made of many materials such as sapphire, silicon carbide, aluminum nitride (AlN), GaN, with a suitable substrate being a 4H polytype of silicon carbide, although other silicon carbide polytypes can also be used including 3C, 6H, and 15R polytypes. Silicon carbide has certain advantages, such as a closer crystal lattice match to Group III nitrides than other substrates and results in Group III nitride films of high quality. Silicon carbide also has a very high thermal conductivity so that the total output power of Group III nitride devices on silicon carbide is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure 52 can emit different wavelengths of light depending on the composition of the active layer and n-type and p-type layers. In some embodiments, the active LED structure 52 emits a blue light in the peak wavelength range of approximately 430 nm to 480 nm. In other embodiments, the active LED structure 52 emits green light in a peak wavelength range of 500 nm to 570 nm. In other embodiments, the active LED structure 52 emits red light in a peak wavelength range of 600 to 650 nm. The LED chip 50 can also be covered with one or more lumiphors or other conversion materials, such as phosphors, such that at least some of the light from the LED passes through the one or more phosphors and is converted to one or more different wavelengths of light. In one embodiment, the LED chip emits a white light combination of light from the LED's active structure and light from the one or more phosphors. The one or more phosphors may include yellow (e.g., YAG:Ce), green (LuAg:Ce), and red ($Ca_{1-x-y}Sr_xEu_y$-AlSiN$_3$) emitting phosphors, and combinations thereof.

As mentioned above, different layers can be included to allow for efficient operation of the LED chip 50. For some semiconductor materials, such as some Group III nitride material systems, current does not effectively spread through the p-type layer. In these embodiments, a current-spreading layer 54 can be on the active LED structure 52 in a location to aid in current-spreading into the p-type layer. In some embodiments the current-spreading layer 54 can cover some or the entire p-type layer, and in some embodiments the current-spreading layer 54 helps spread current from a p-type contact across the surface of the p-type layer as described in more detail below. This helps to provide improved current-spreading across the p-type layer with a corresponding improvement in current injection from the p-type layer.

The current-spreading layer 54 can comprise many different materials and is typically a transparent conductive oxide such as ITO or a metal such as platinum (Pt), although other materials can also be used. The current-spreading layer can have many different thicknesses, with the present disclosure having a thickness small enough to minimize absorption of light from the active structure that passes through the current-spreading layer. Some embodiments of current-spreading layer 54 comprising ITO can have thicknesses less than 1000 angstroms (Å), while other embodiments can have a thickness less than 700 Å. Still other embodiments can have a thickness less than 500 Å. Still other embodiments can have a thickness in the range of 50 Å to 300 Å, with some of these embodiments having a current-spreading layer with a thickness of approximately 200 Å. The current-spreading layer 54 and the reflective layers described below can be deposited using known methods. It is understood that in embodiments where current spreading is not a concern, the LED chips can be provided without a current-spreading layer.

The LED chip 50 can also comprise a first reflective layer 56 that can be formed on the active LED structure 52, and in the embodiment shown is formed on the current-spreading layer 54 with current-spreading layer 54 between a first reflective layer 56 and the active LED structure 52. The first reflective layer 56 can comprise many different materials and preferably comprises a material that presents an index of refraction step with the material comprising the active LED structure 52. Stated differently, the first reflective layer 56 should have an index of refraction that is smaller than that of the active LED structure 52 to promote TIR of active structure light-emitting toward the first reflective layer 56, as shown by first light trace 58. Light that experiences TIR is reflected without experiencing absorption or loss, and TIR allows for the efficient reflection of active structure light so that it can contribute to useful or desired LED chip emission. In embodiments that rely solely on metal layers to reflect light, the light experiences loss with each reflection (as described above), which can reduce overall LED chip emission efficiency.

In some embodiments, the first reflective layer 56 comprises a material with an index of refraction lower than the index of refraction of the active LED structure 52 material, with the lower index of refraction material providing for increased TIR of light from the active LED structure 52. The first reflective layer 56 may comprise many different materials, with some having an index of refraction less than 2.3, while others can have an index of refraction less than 2.15, less than 2.0, and less than 1.5. In some embodiments the first reflective layer 56 comprises a dielectric material, with some embodiments comprising silicon dioxide and/or silicon nitride. It is understood that many dielectric materials can be used such as SiN, SiNx, Si$_3$N$_4$, Si, Ge, SiO$_2$, SiOx, TiO$_2$, Ta$_2$O$_5$, ITO, MgOx, ZnO, and combinations thereof.

As mentioned above, some Group III nitride materials such as GaN can have an index of refraction of approximately 2.4, and silicon dioxide can have an index of refraction of approximately 1.48, and silicon nitride can have an index of refraction of approximately 1.9. Embodiments with an active LED structure 52 comprising GaN and the first reflective layer 56 that comprises silicon dioxide can have a sufficient index of refraction step between the two to allow for efficient TIR of light at the junction between the two as shown by first light trace 58. The first reflective layer 56 can have different thicknesses depending on the type of materials used, with some embodiments having a thickness of at least 0.2 microns (μm). In some of these embodiments it can have a thickness in the range of 0.2 μm to 0.7 μm, while in some of these embodiments it can be approximately 0.5 μm thick.

As light experiences TIR at the junction with the first reflective layer 56, an evanescent wave with exponentially decaying intensity can extend into the first reflective layer 56. This wave is most intense within approximately one third of the light wavelength from the junction (about 0.3 μm for 450 nm light in silicon dioxide). If the thickness of the first reflective layer 56 is too thin, such that significant intensity remains in the evanescent wave at the interface between the first reflective layer 56 and a second reflective layer 60, a portion of the light can reach the second reflective layer 60. This in turn can reduce the TIR reflection at the first interface. For this reason, in some embodiments the first reflective layer 56 should have a thickness of at least 0.3 µm.

As mentioned above, an LED chip 50 according to some embodiments can also utilize the second reflective layer 60, such as a metal layer, on the first reflective layer 56 to reflect any light that may pass through the first reflective layer 56. An example of the light reflected at the second reflective layer 60 is shown by second light trace 62, which passes first through the first reflective layer 56 before being reflected at the second reflective layer 60. The second reflective layer 60 can comprise many different materials such as Ag, Au, Al, or combinations thereof, with the present embodiment being Ag. Some embodiments may also comprise an adhesion layer 64 between the first reflective layer 56 and the second reflective layer 60 to promote adhesion between the two. Many different materials can be used for the adhesion layer 64, such as TiO, TiON, TiO$_2$, tantalum oxide (TaO), TaON, Ta$_2$O$_5$, AlO, or combinations thereof, with a preferred material being TiON. The adhesion layer 64 may have many different thicknesses from just a few angstroms to thousands of angstroms. In some embodiments it can be less than 100 Å, while in other embodiments it can be less than 50 Å. In some of these embodiments, it can be approximately 20 Å thick. The thickness of the adhesion layer 64 and the material used should minimize the absorption of light passing to minimize losses of light reflecting off the second reflective layer 60.

Figure 5B:
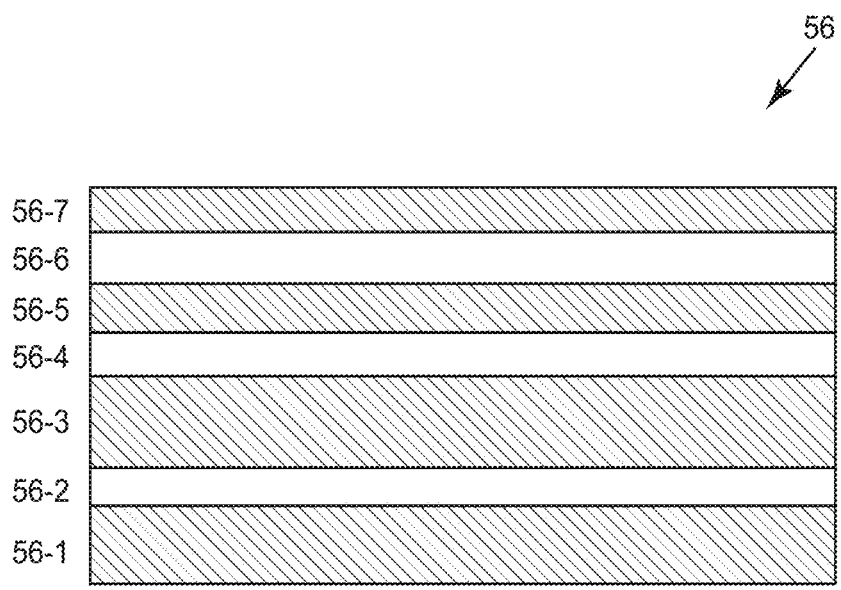
FIG. 5B is a partial cross-sectional representation of a reflective layer of an LED according to some embodiments.

As stated above, the interface between the first reflective layer 56 and the active LED structure 52 includes an index of refraction step to promote TIR of light, as shown by first light trace 58. However, depending on the angle of incidence, some light may still pass through the first reflective layer 56 before being reflected at the second reflective layer 60, as depicted by the second light trace 62. FIG. 5B illustrates a sectional illustration of the first reflective layer 56 according to some embodiments. The first reflective layer 56 includes a plurality of layers (56-1, 56-2, 56-3, 56-4, 56-5, 56-6, and 56-7) configured to provide a plurality of different interfaces between them. Additionally, layer 56-1 forms an interface with the active LED structure 52 and layer 56-7 forms an interface with either the adhesion layer 64 or the second reflective layer 60 of FIG. 5A. Each different interface promotes TIR of light having a different angle of incidence range and accordingly, the total amount of light reflected by the first reflective layer 56 is increased, and the amount of light reaching the second reflective layer 60 is reduced.

A different interface may be formed from materials having different indexes of refraction. For example, layer 56-1 may include silicon dioxide and layer 56-2 may include silicon nitride. Accordingly, the interface between layer 56-1 and the active LED structure 52 is different from the interface between layer 56-1 and layer 56-2. If two interfaces are provided between the same two materials, then the interfaces may be different by varying the optical thickness of each layer. Optical thickness can be defined as the product of the refractive index of the material and the geometric length the path of light travels. Accordingly, the optical thickness of a layer of material may be changed by increasing or decreasing the actual layer thickness. A layer with a larger optical thickness will generally promote TIR of light having shallower angles of incidence than another layer with a smaller optical thickness. Accordingly, a plurality of layers with varying optical thicknesses allow some layers to reflect more light of shallower angles of incidence while having other layers that reflect more light at greater angles of incidence, thus providing the plurality of layers with increased total reflection over all angles.

In some embodiments, the first reflective layer 56 includes a plurality of first dielectric layers 56-1, 56-3, 56-5, and 56-7 of a first material and a plurality of second dielectric layers 56-2, 56-4, and 56-6 of a second material that is different from the first material. If the thickness of each of the plurality of first dielectric layers 56-1, 56-3, 56-5, and 56-7 is varied, then each of the interfaces, that is, 56-1 and 56-2, 56-2 and 56-3, 56-3 and 56-4, 56-4 and 56-5, and 56-5 and 56-6, will be different, and accordingly, each interface may promote TIR of light having different angle of incidence ranges. In some embodiments, the thickness of each of the plurality of second dielectric layers 56-2, 56-4, and 56-6 may also be varied. In some embodiments, the first material is silicon dioxide and the second material is silicon nitride. In other embodiments, the first and second material may be any combination of SiN, SiNx, Si$_3$N$_4$, Si, Ge, SiO$_2$, SiOx, TiO$_2$, Ta$_2$O$_5$, ITO, MgOx, ZnO, or related materials. As illustrated in FIG. 5B, some embodiments include an uneven number of first dielectric layers and an even number of second dielectric layers. In other embodiments, the number of the first dielectric layers is equal to the number of the second dielectric layers. The thickness of the plurality of first dielectric layers 56-1, 56-3, 56-5, and 56-7 may be varied in different configurations within the first reflective layer 56. For example, the thickness of each layer of the plurality of first dielectric layers 56-1, 56-3, 56-5, and 56-7 may increase or decrease sequentially within the first reflective layer 56. In other embodiments, a thickest layer (illustrated as layer 56-3 in FIG. 5B) of the plurality of first dielectric layers 56-1, 56-3, 56-5, and 56-7 is between other layers (56-1, 56-5, and 56-7) of the plurality of first dielectric layers 56-1, 56-3, 56-5, and 56-7. The thickest layer (layer 56-3 in FIG. 5B) has the longest optical thickness and is good for promoting TIR of light having the shallowest angles of incidence, such as 0 to 15 degrees, compared with the other layers (layers 56-1, 56-5, and 56-7). By placing the thickest layer (layer 56-3) between the other layers (layers 56-1, 56-5, and 56-7), at least some light with greater angles of incidence, such as greater than 15 degrees, may be reflected earlier without potentially being lost to absorption within the first reflective layer 56. In FIG. 5B, the thickest layer of the plurality of first dielectric layers 56-1, 56-3, 56-5, and 56-7 is illustrated as layer 56-3; however, layer 56-5 could also be the thickest layer without deviating from the principles of these embodiments.

Accordingly, some embodiments disclosed herein include an LED chip that includes a first reflective layer that includes a plurality of dielectric layers with varying optical thicknesses. In some embodiments, an LED chip comprising an active structure comprising an active layer between an n-type layer and a p-type layer; a first reflective layer adjacent the active LED structure and comprising a plurality of first dielectric layers and a plurality of second dielectric layers wherein each layer of the plurality of first dielectric layers comprises a different thickness; wherein a thickest layer of the plurality of first dielectric layers is between other layers of the plurality of first dielectric layers.

In some embodiments, an average thickness of the plurality of first dielectric layers 56-1, 56-3, 56-5, and 56-7 is greater than an average thickness of the plurality of second dielectric layers 56-2, 56-4, and 56-6. However, in some embodiments, at least one layer of the plurality of second dielectric layers 56-2, 56-4, and 56-6 has a thickness greater than at least one of the plurality of first dielectric layers 56-1, 56-3, 56-5, and 56-7. For example, the plurality of first dielectric layers 56-1, 56-3, 56-5, and 56-7 may comprise silicon dioxide, and the plurality of second dielectric layers 56-2, 56-4, and 56-6 comprise silicon nitride, and the thickness of layer 56-1 is from 190 nm to 200 nm, the thickness of layer 56-2 is from 50 nm to 60 nm, the thickness of layer 56-3 is from 335 nm to 345 nm, the thickness of layer 56-4 is from 55 nm to 65 nm, the thickness of layer 56-5 is from 75 nm to 85 nm, the thickness of layer 56-6 is from 60 nm to 70 nm, and the thickness of layer 56-7 is from 45 nm to 55 nm. In some embodiments, the average thickness of the plurality of first dielectric layers is greater than the average thickness of the plurality of second dielectric layers by at least a factor of 2. In other embodiments, the average thickness of the plurality of first dielectric layers is greater than the average thickness of the plurality of second dielectric layers by at least a factor of 3.

Figure 5C:
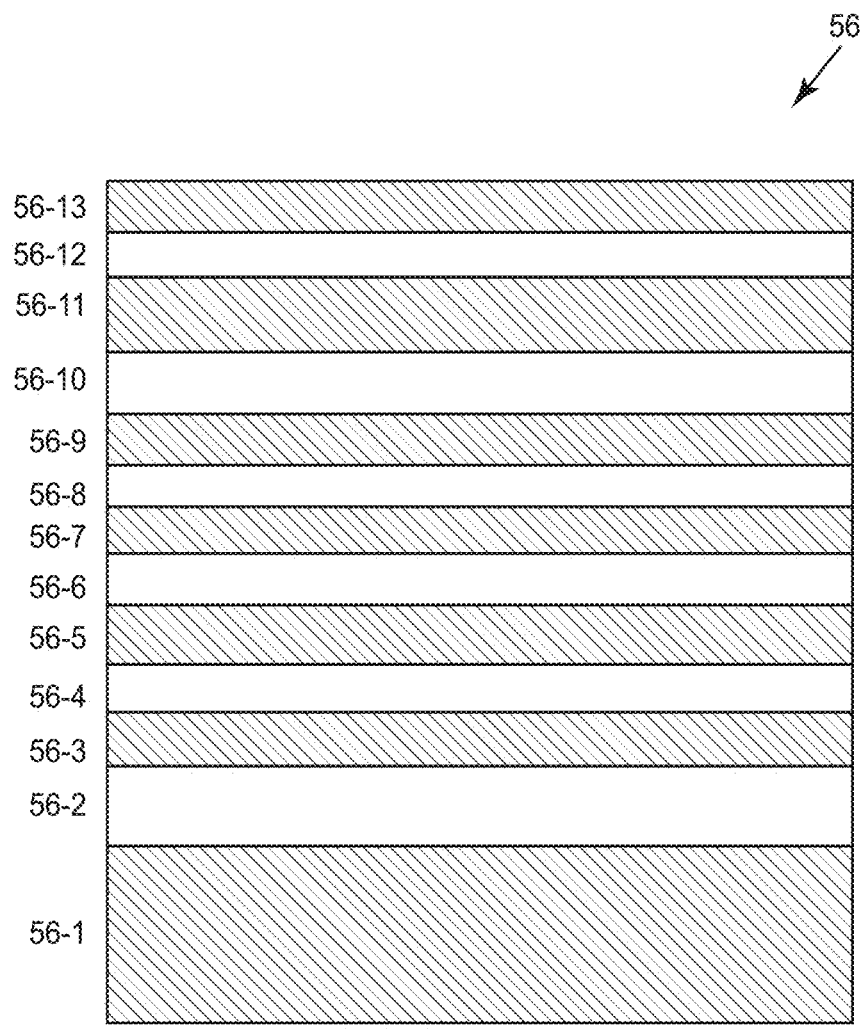
FIG. 5C is a partial cross-sectional representation of a reflective layer of an LED according to some embodiments.

FIG. 5C illustrates a sectional illustration of the first reflective layer 56 according to other embodiments. In FIG. 5C, the first reflective layer 56 includes a plurality of layers (56-1, 56-2, 56-3, 56-4, 56-5, 56-6, 56-7, 56-8, 56-9, 56-10, 56-11, 56-12, 56-13) configured to provide a plurality of different interfaces between them. Layer 56-1 forms an interface with the active LED structure 52 of FIG. 5A and layer 56-7 forms an interface with either the adhesion layer 64 or the second reflective layer 60 of FIG. 5A. Each different interface promotes TIR of light having a different angle of incidence range, and accordingly, the total amount of light reflected by the first reflective layer 56 is increased and the amount of light reaching the second reflective layer 60 is reduced. In some embodiments, the first reflective layer 56 includes a plurality of first dielectric layers 56-1, 56-3, 56-5, 56-7, 56-9, 56-11, and 56-13 of a first material and a plurality of second dielectric layers 56-2, 56-4, 56-6, 56-8, 56-10, and 56-12 of a second material that is different from the first material. The first material and the second material may be any material or any combination of the materials described above for FIG. 5B. The thicknesses of each layer of the plurality first dielectric layers and each layer of the plurality of second dielectric layers may be varied as described above for FIG. 5B.

In FIG. 5C, the thickest layer is illustrated as layer 56-1, which forms an interface with the active LED structure of FIG. 5A. As described above for FIG. 5B, the thickest layer (layer 56-1 in FIG. 5C) has the longest optical thickness and is good for promoting TIR of light having the shallowest angles of incidence, such as 0 to 15 degrees, compared with the other layers. In order to reduce the chances that light of greater angles of incidence, such as greater than 15 degrees, is lost to absorption, additional layers (layers 56-8, 56-9, 56-10, 56-11, 56-12, and 56-13 when compared with FIG. 5B) with different optical thicknesses are provided. In some embodiments, the thickest layer (layer 56-1) is at least 5 times thicker than any other layer of the plurality of first dielectric layers (layers 56-3, 56-5, 56-7, 56-9, 56-11, and 56-13) and the plurality of second dielectric layers (layers 56-2, 56-4, 56-6, 56-8, 56-10, and 56-12). In some embodiments, the thinnest layer (layer 56-13) of the plurality of first dielectric layers forms an interface with either the adhesion layer 64 or the second reflective layer 60 of FIG. 5A.

In some embodiments, an average thickness of the plurality of first dielectric layers (layers 56-1, 56-3, 56-5, 56-7, 56-9, 56-11, and 56-13) is at least 2 times greater than an average thickness of the plurality of second dielectric layers (layers 56-2, 56-4, 56-6, 56-8, 56-10, and 56-12). In further embodiments, at least one layer of the plurality of second dielectric layers (layers 56-2, 56-4, 56-6, 56-8, 56-10, and 56-12) is at least 2 times thicker than the thinnest layer (56-13) of the plurality of first dielectric layers (layers 56-1, 56-3, 56-5, 56-7, 56-9, 56-11, and 56-13). In some embodiments, the plurality of first dielectric layers (layers 56-1, 56-3, 56-5, 56-7, 56-9, 56-11, and 56-13) comprises silicon dioxide, and the plurality of second dielectric layers (layers 56-2, 56-4, 56-6, 56-8, 56-10, and 56-12) comprises silicon nitride, and the thickness of layer 56-1 is from 480 nm to 490 nm, the thickness of layer 56-2 is from 80 nm to 90 nm, the thickness of layer 56-3 is from 50 nm to 60 nm, the thickness of layer 56-4 is from 55 nm to 65 nm, the thickness of layer 56-5 is from 65 nm to 75 nm, the thickness of layer 56-6 is from 60 nm to 70 nm, the thickness of layer 56-7 is from 65 nm to 75 nm, the thickness of layer 56-8 is from 55 nm to 65 nm, the thickness of layer 56-9 is from 50 nm to 60 nm, the thickness of layer 56-10 is from 70 nm to 80 nm, the thickness of layer 56-11 is from 80 nm to 90 nm, the thickness of layer 56-12 is from 65 nm to 75 nm, and the thickness of layer 56-13 is from 45 nm to 55 nm.

Figure 5D:
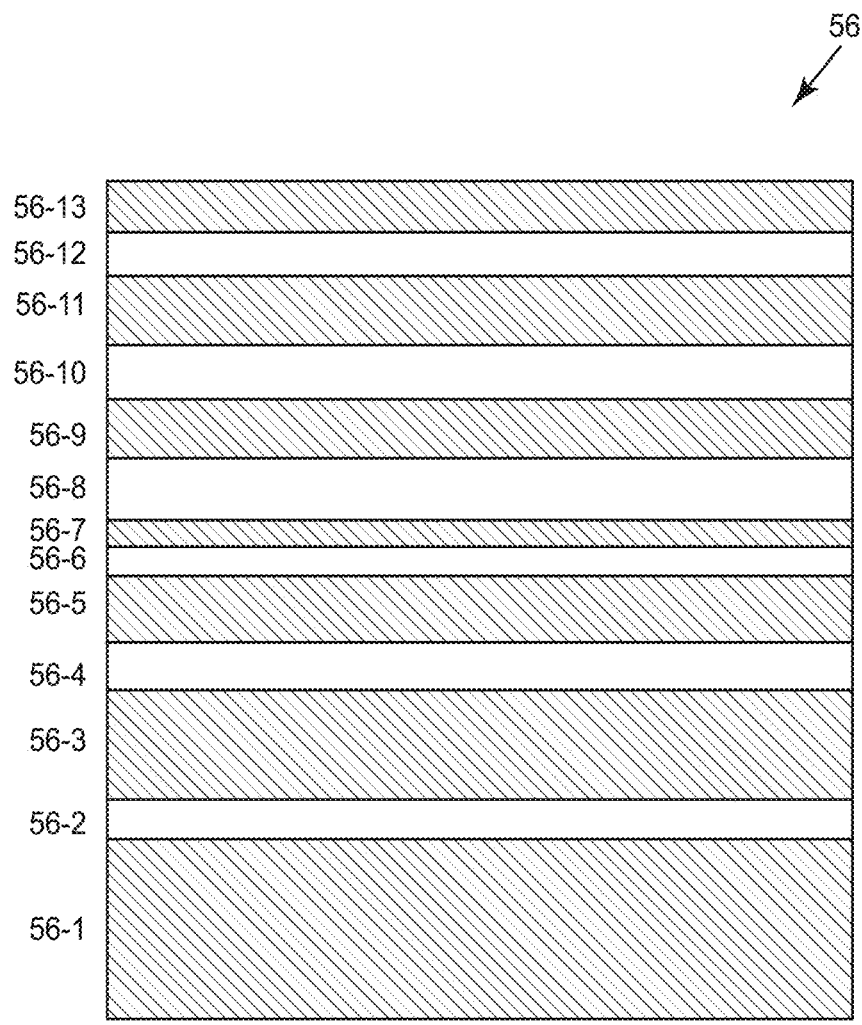
FIG. 5D is a partial cross-sectional representation of a reflective layer of an LED according to some embodiments.

FIG. 5D illustrates a sectional illustration of the first reflective layer 56 according to other embodiments. The embodiments of FIG. 5D are similar to the embodiments of FIG. 5C. Accordingly, the description of FIG. 5C also applies to FIG. 5D with differences provided below.

In FIG. 5D, the thickest layer is also illustrated as layer 56-1, which forms an interface with the active LED structure 52 of FIG. 5A. The second thickest layer is illustrated as layer 56-3 and both layers 56-1 and 56-3 are notably thicker than any other layer of the first reflective layer 56. Accordingly, layers 56-1 and 56-3 have the largest two optical thicknesses and promote TIR of light having shallower angles of incidence than the other layers. Layer 56-3 has a different optical thickness than layer 56-1 and will trade off some shallow angle reflection to increase reflection at greater angles, thus helping increase the total reflection over all angles. In some embodiments, the thickest layer (layer 56-1) is at least 2 times thicker than the second thickest layer (layer 56-3) and at least 5 times thicker than any other layer of the plurality of first dielectric layers (layers 56-5, 56-7, 56-9, 56-11, and 56-13). Additionally, the thickest layer (layer 56-1) is at least 6 times thicker than any of the plurality of second dielectric layers (layers 56-2, 56-4, 56-6, 56-8, 56-10, and 56-12). When the first reflective layer 56 of FIG. 5A is configured as illustrated in FIG. 5D, layers 56-1 and 56-3 are closer to the active LED structure 52 than any other layer of the plurality of first dielectric layers (56-5, 56-7, 56-9, 56-11, and 56-13). Accordingly, more light with shallow angles of incidence are reflected earlier than the embodiments described for FIG. 5C. In turn, at least one other layer of the plurality of first dielectric layers (layers 56-5, 56-7, 56-9, 56-11, and 56-13) is much thinner than any other layer. In FIG. 5D, the thinnest layer is illustrated as layer 56-7, but it is understood in various embodiments that the thinnest layer could be any of layers (layers 56-5, 56-7, 56-9, 56-11, and 56-13). In some embodiments, the thickest layer (layer 56-1) is at least 10 times thicker than the thinnest layer (layer 56-7) of the plurality of first dielectric layers and in further embodiments, the thickest layer (layer 56-1) is at least 16 times thicker than the thinnest layer (layer 56-7). Additionally, the thickest layer (layer 56-4) of the plurality of second dielectric layers is at least 2 times thicker than the thinnest layer (layer 56-7) of the plurality of first dielectric layers, and the thinnest layer (layer 56-6) of the plurality of second dielectric layers is at least one and a half times thicker than the thinnest layer (layer 56-7).

In some embodiments, the plurality of first dielectric layers (layers 56-1, 56-3, 56-5, 56-7, 56-9, 56-11, and 56-13) comprises silicon dioxide, and the plurality of second dielectric layers (layers 56-2, 56-4, 56-6, 56-8, 56-10, and 56-12) comprises silicon nitride, and the thickness of layer 56-1 is from 490 nm to 510 nm, the thickness of layer 56-2 is from 60 nm to 70 nm, the thickness of layer 56-3 is from 195 nm to 205 nm, the thickness of layer 56-4 is from 70 nm to 80 nm, the thickness of layer 56-5 is from 90 nm to 100 nm, the thickness of layer 56-6 is from 40 nm to 50 nm, the thickness of layer 56-7 is from 25 nm to 35 nm, the thickness of layer 56-8 is from 70 nm to 80 nm, the thickness of layer 56-9 is from 70 nm to 80 nm, the thickness of layer 56-10 is from 65 nm to 75 nm, the thickness of layer 56-11 is from 80 nm to 90 nm, the thickness of layer 56-12 is from 60 nm to 70 nm, and the thickness of layer 56-13 is from 55 nm to 65 nm.

Accordingly, the first reflective layer 56 of FIG. 5A may comprise a plurality of dielectric layers. The plurality of dielectric layers may comprise embodiments in which each dielectric layer of the plurality of dielectric layers comprises a different thickness. In some embodiments, the first reflective layer 56 comprises from 7 to 13 dielectric layers. In some embodiments, the first reflective layer 56 comprises a plurality of alternating first dielectric layers and second dielectric layers. The first dielectric layers may have a different index of refraction than the second dielectric layers. In some embodiments, the plurality of first dielectric layers comprises silicon dioxide and the plurality of second dielectric layers comprises silicon nitride, although other material combinations are possible as described above. In some embodiments, the first reflective layer 56 comprises an uneven number of first dielectric layers and second dielectric layers, while in other embodiments, the first reflective layer 56 comprises an even number of first dielectric layers and of second dielectric layers. In some embodiments, the first reflective layer 56 comprises an aperiodic Bragg reflector. In some embodiments, the first reflective layer 56 comprises a plurality of dielectric layers in which the thickest dielectric layer of the plurality of dielectric layers is spaced from the active layer by at least one thinner dielectric layer. In other embodiments, the thickest dielectric layer is adjacent the active LED structure and in further embodiments, the second thickest dielectric layer is adjacent the thickest dielectric layer when compared with other layers of the plurality of first dielectric layers. In some embodiments, the first reflective layer 56 comprises a plurality of first dielectric layers having an average thickness that is greater than an average thickness of a plurality of second dielectric layers, and at least one layer of the plurality of second dielectric layers has a thickness greater than at least one layer of the plurality of first dielectric layers. In some embodiments, the thickest layer of the plurality of first dielectric layers is at least 10 times thicker than the thinnest layer of the plurality of first dielectric layers, and in further embodiments, the thickest layer of the plurality of first dielectric layers is at least 16 times thicker than the thinnest layer of the plurality of first dielectric layers.

Accordingly, some embodiments disclosed herein include an LED chip comprising an active LED structure comprising an active layer between an n-type layer and a p-type layer, and a first reflective layer adjacent the active LED structure and comprising a plurality of first dielectric layers and a plurality of second dielectric layers, wherein an average thickness of the plurality of first dielectric layers is greater than an average thickness of the plurality second dielectric layers, and wherein at least one layer of the plurality of second dielectric layers comprises a thickness greater than at least one layer of the plurality of first dielectric layers.

As discussed above, in some embodiments, the first reflective layer 56 comprises a plurality of alternating first and second dielectric layers of varying materials with different indexes of refraction and thicknesses that promote TIR over a wide range of angles of incidence. Accordingly, the first reflective layer 56 may be referred to as an aperiodic Bragg reflector. In contrast, a periodic Bragg reflector typically consists of multiple pairs of two materials with alternating higher and lower indexes of refraction. The thickness of each material is chosen so that reflected waves are in constructive interference, and the thickness of each material is kept constant among the repeating pairs. Periodic Bragg reflectors offer improved reflectivity over single dielectric reflectors or metal reflectors, but the improved reflectivity is limited to a particular angle of incidence range.

Figure 6A:
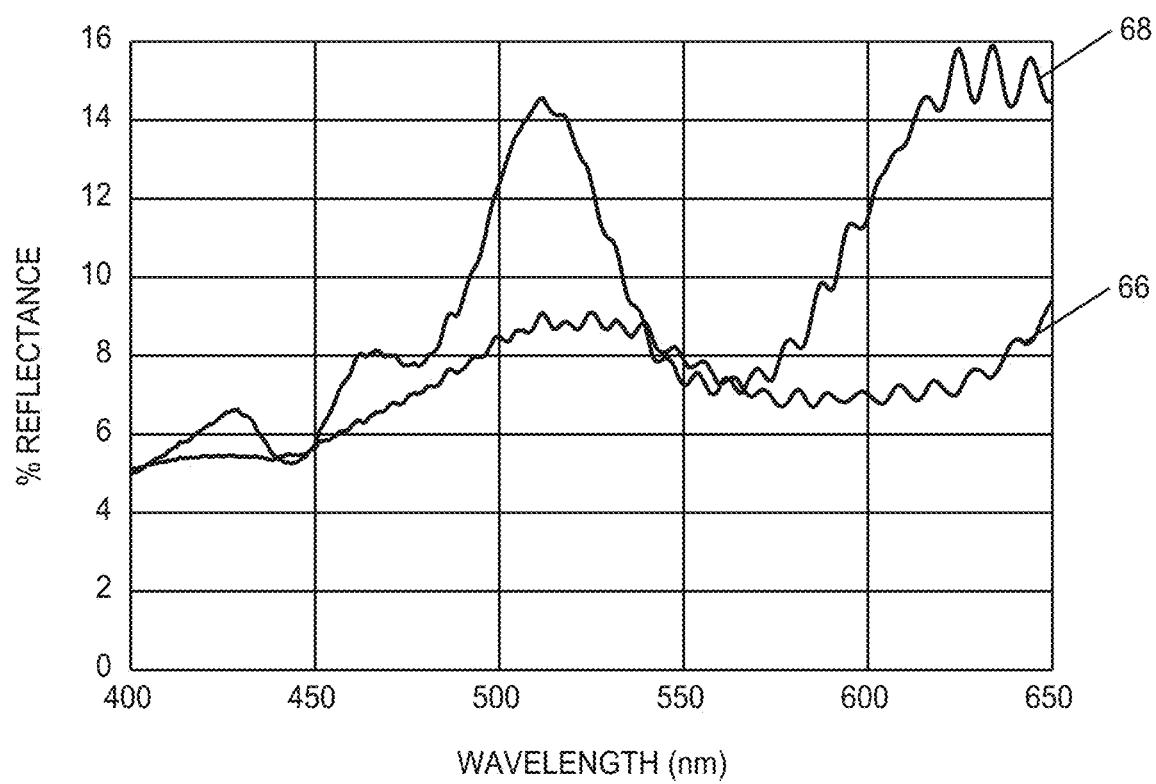
FIG. 6A is a graph comparing the percent reflectance over a wide wavelength range at a zero degree angle of incidence for some embodiments.

FIG. 6A is a graph comparing the percent reflectance over a wide wavelength range at a zero degree angle of incidence for some embodiments. Each embodiment includes a first reflective layer and a second reflective layer on an active LED structure. Line 66 represents an embodiment in which the first reflective layer is a single dielectric layer of silicon dioxide and the second reflective layer is silver. Line 68 represents an embodiment in which the first reflective layer comprises a plurality of first and second dielectric layers including silicon dioxide and silicon nitride with compositions and thicknesses as described above, and the second reflective layer is silver. Line 68 has noticeably higher reflectivity at most wavelengths. For example, the reflectivity is at least 2% higher at some wavelengths above 450 nm and about 5% higher at some wavelengths from 500 nm to 530 nm.

Figure 6C:
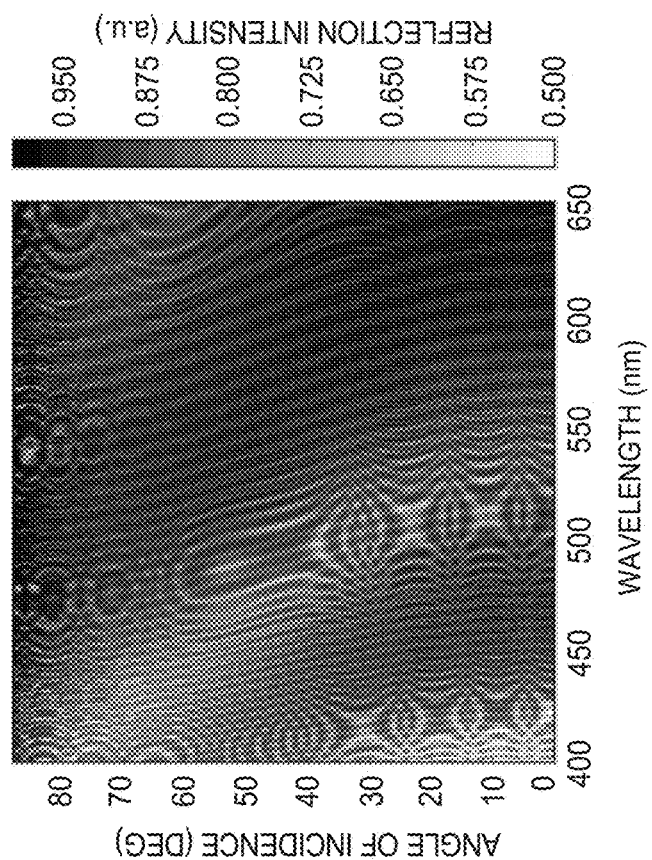
FIG. 6C is a heat map representation comparing the reflection intensity for a wide angle of incidence (AOI) range and across a wide wavelength range for some embodiments.
Figure 6B:
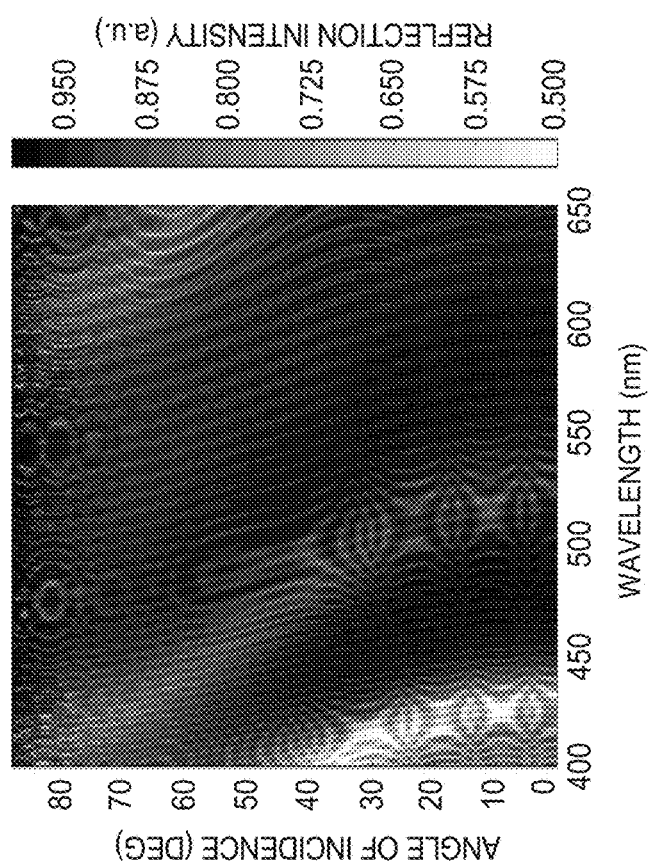
FIG. 6B is a heat map representation comparing the reflection intensity for a wide angle of incidence (AOI) range and across a wide wavelength range for some embodiments.

FIG. 6B and FIG. 6C are heat map representations comparing reflection intensity across a wide angle of incidence (AOI) range and across a wide wavelength range. As with FIG. 6A, the embodiments represented by FIG. 6B and FIG. 6C both include a first reflective layer and a second reflective layer on an active LED structure. FIG. 6B represents an embodiment in which the first reflective layer comprises a plurality of first and second dielectric layers including silicon dioxide and silicon nitride with compositions and thicknesses as described above, and the second reflective layer is silver, as for example, the LED chip of FIG. 5A with the first reflective layer 56 of FIG. 5D. FIG. 6C represents an embodiment in which the first reflective layer is a single dielectric layer of silicon dioxide and the second reflective layer is silver. Notably, the percent reflectance improvements illustrated in FIG. 6A for zero angle of incidence are also realized across a wide angle of incidence range. For example, at a most wavelengths from 400 nm to 650 nm, the embodiment of FIG. 6B has greater reflection intensity (represented as darker regions) than the embodiment of FIG. 6C across the most angles of incidence.

Figure 4:
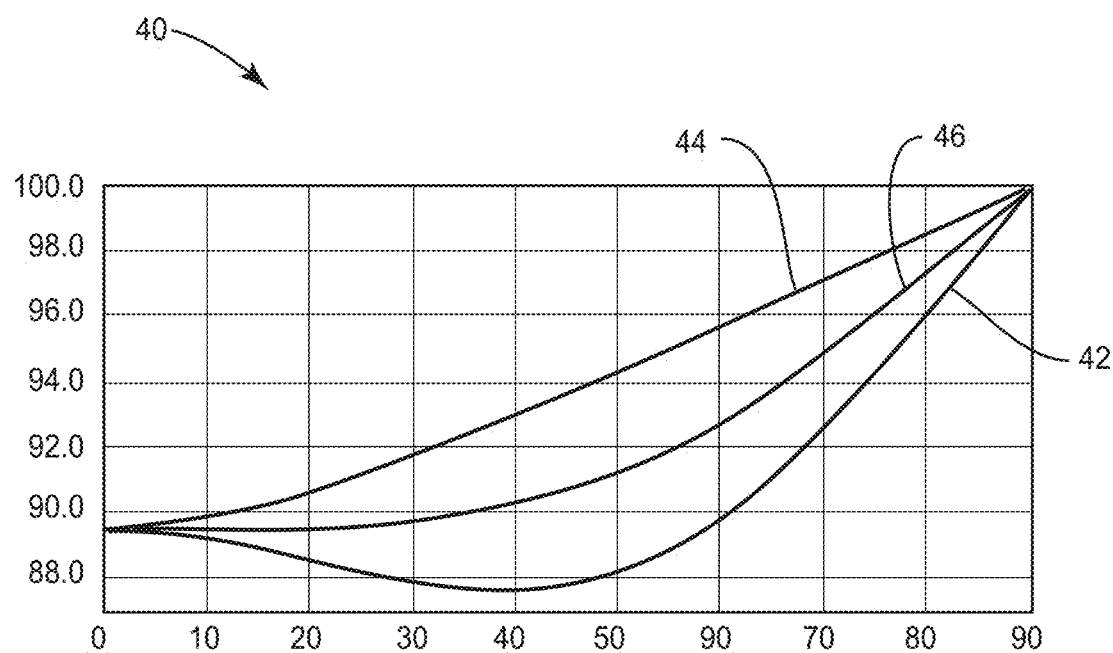
FIG. 4 is a graph showing the reflectivity of a metal reflector at different viewing angles.
Figure 7:
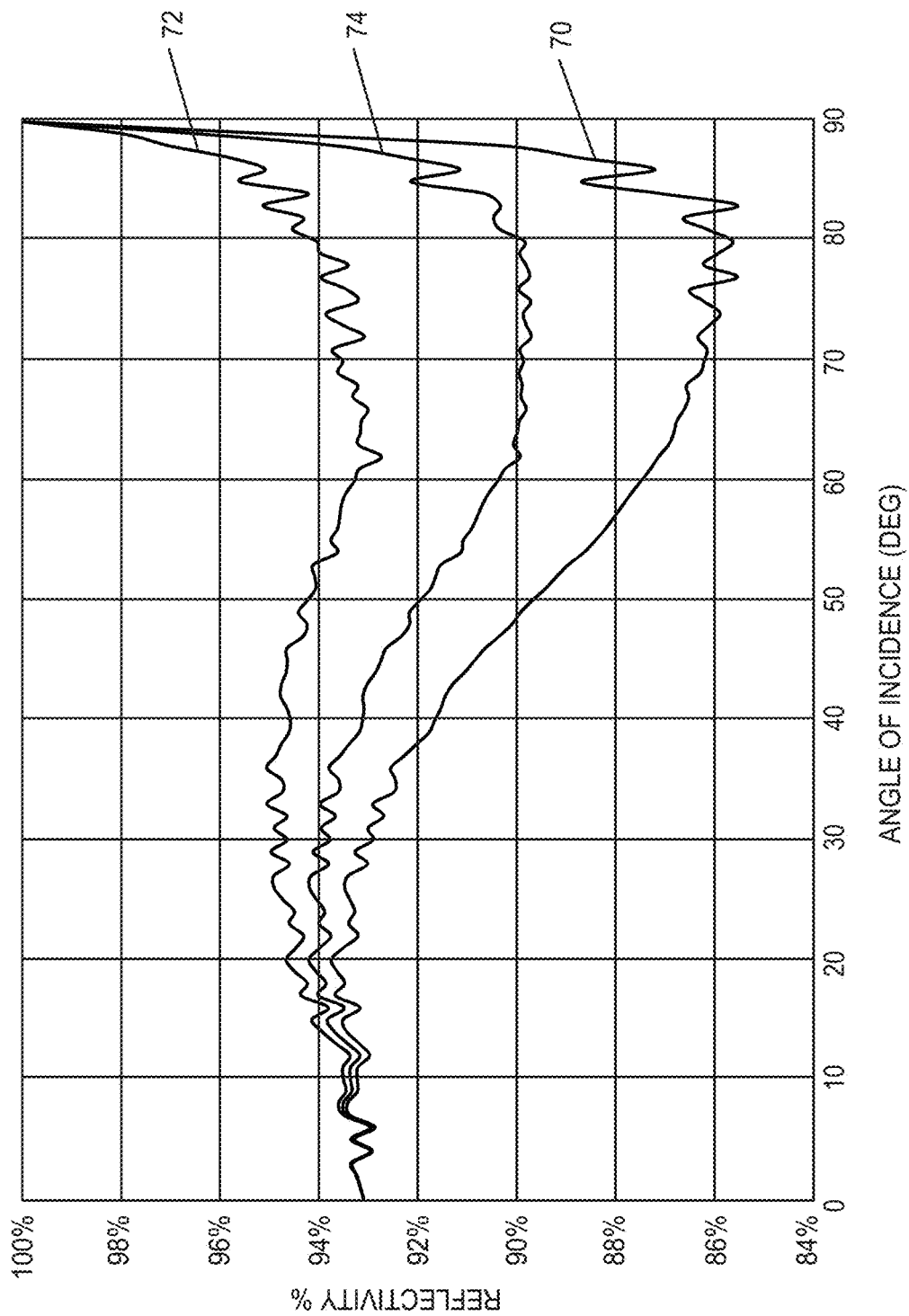
FIG. 7 is a graph showing the reflectivity of a reflective layer at different viewing angles according to some embodiments.

FIG. 7 is a graph representing the reflectivity percent (%) of a sample including a first reflective layer and a second reflective layer on an active LED structure. The first reflective layer comprises a plurality of first and second dielectric layers including silicon dioxide and silicon nitride with compositions and thicknesses as described above, and the second reflective layer is silver, as for example, the LED chip of FIG. 5A with the first reflective layer 56 of FIG. 5D. The reflectivity percent (y-axis) is plotted at different angles of incidence (x-axis) for light with a wavelength of 460 nm. The graph shows the p-polarization reflectivity 70, s-polarization reflectivity 72, and average reflectivity 74, with the average reflectivity 74 generally illustrating the overall reflectivity of the first reflective layer for the purpose of LEDs in which light is generated with random polarization. Notably, the reflectivity is substantially improved when compared with the similar graph of FIG. 4 that represents only a silver reflective layer on GaN. For example, the average reflectivity 74 at zero degrees is at least 93% and exceeds 94% for most angles from about 15 degrees to over 50 degrees.

Figure 8:
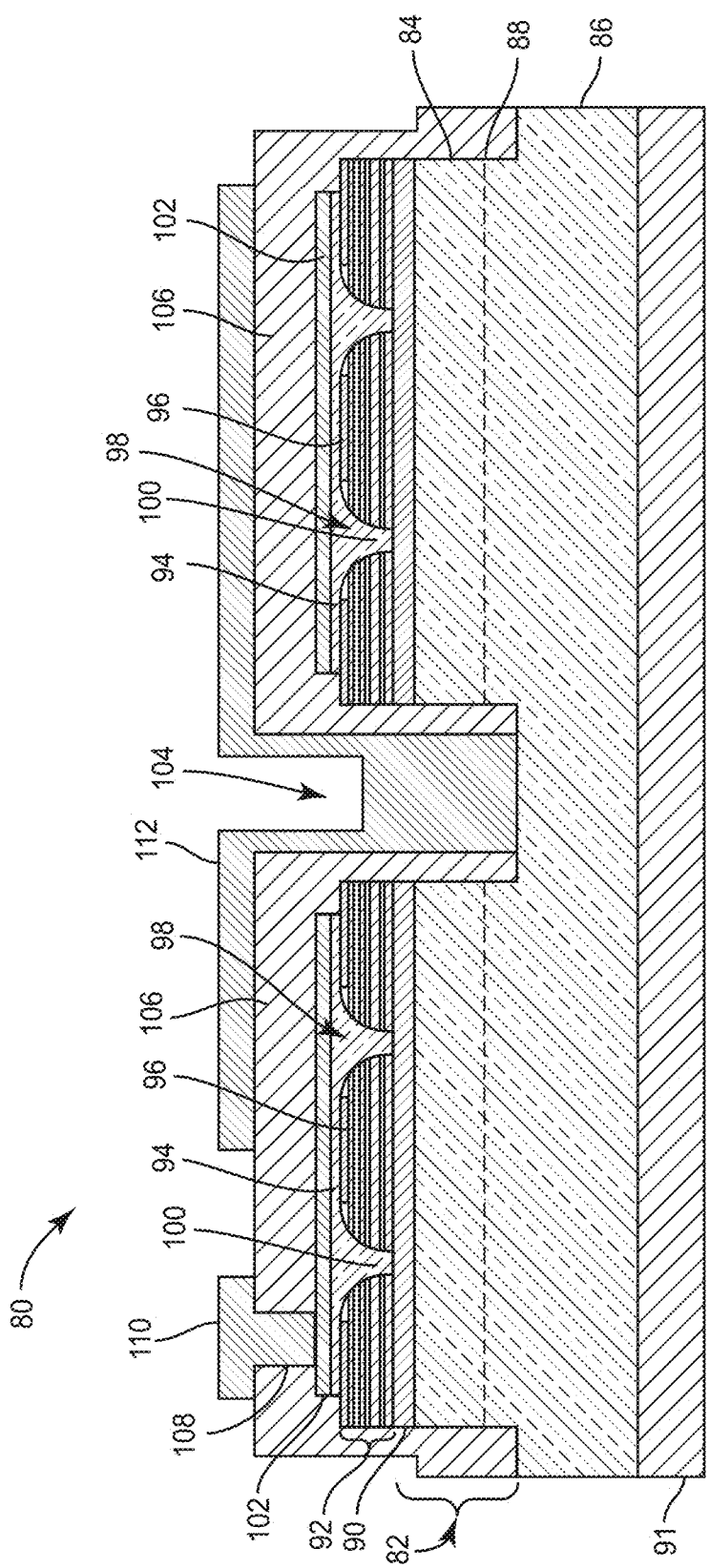
FIG. 8 is a cross-sectional illustration of an LED according to some embodiments.

It is understood that the first reflective layer 56 arrangements described above can be used in many different LED chips according to the present disclosure. FIG. 8 illustrates some embodiments of an LED chip 80 having a lateral geometry and arranged for flip-chip mounting. The LED chip 80 comprises an active LED structure 82 comprising a p-type layer 84, n-type layer 86, and an active layer 88 formed on a substrate 91. In some embodiments, the n-type layer 86 is between the active layer 88 and the substrate 91. In other embodiments, the p-type layer 84 is between the active layer 88 and the substrate 91. The substrate 91 can comprise many different materials such as silicon carbide or sapphire and can have one or more surfaces that are shaped, textured, or patterned to enhance light extraction.

The LED chip 80 also comprises a current-spreading layer 90 that is between the active LED structure 82 and a first reflective layer 92. The current-spreading layer 90 can have the same thickness and can comprise the same materials as the current-spreading layer 54 shown in FIG. 5A and described above. In LED chip 80, the current-spreading layer 90 can comprise ITO and is on the p-type layer 84 to spread current into the p-type layer 84. The first reflective layer 92 is arranged on the current-spreading layer 90 and adjacent the p-type layer 84 and can have any of the embodiments with a plurality of layers previously described for the first reflective layer 56, for example, as described for FIG. 5B. For example, in LED chip 80 the first reflective layer 92 may comprise a plurality of dielectric layers. The plurality of dielectric layers may comprise embodiments in which each dielectric layer of the plurality of dielectric layers comprises a different thickness. In some embodiments, the first reflective layer 92 comprises from 7 to 13 dielectric layers. In some embodiments, the first reflective layer 92 comprises a plurality of alternating first dielectric layers and a plurality of alternating second dielectric layers. The plurality of first dielectric layers may have a different index of refraction than the plurality second dielectric layers. In further embodiments, the plurality of first dielectric layers comprises silicon dioxide and the plurality of second dielectric layers comprises silicon nitride, although other material combinations are possible as described above. In some embodiments, the first reflective layer 92 comprises an uneven number of first dielectric layers and second dielectric layers, while in other embodiments, the first reflective layer 92 comprises an even number of first dielectric layers and of second dielectric layers. In some embodiments, the first reflective layer 92 comprises an aperiodic Bragg reflector. In some embodiments, the first reflective layer 92 comprises a plurality of dielectric layers in which the thickest dielectric layer of the plurality of dielectric layers is spaced from the active layer by at least one thinner dielectric layer. In some embodiments, the first reflective layer 92 comprises a plurality of first dielectric layers having an average thickness that is greater than an average thickness of a plurality of second dielectric layers, and at least one layer of the plurality of second dielectric layers has a thickness greater than at least one layer of the plurality of first dielectric layers. All other embodiments described for the first reflective layer 56 (FIG. 5B) are also applicable to the first reflective layer 92.

A second reflective layer 94 and an adhesion layer 96 are included on the first reflective layer 92, with the adhesion layer 96 sandwiched between and providing adhesion between the second reflective layer 94 and first reflective layer 92. These layers can comprise the same material and can have the same thickness as the second reflective layer 60 and adhesion layer 64 described above for FIG. 5A. For example, in some embodiments, the second reflective layer 94 comprises an electrically conductive material, such as silver or other metals.

The LED chip 80 further comprises reflective layer holes 98 that can pass through the adhesion layer 96 and the first reflective layer 92 to the current-spreading layer 90. The holes 98 can then be filled or partially filled when the second reflective layer 94 is deposited. Accordingly, the second reflective layer 94 is formed on the first reflective layer 92 and comprises vias 100 to the current-spreading layer 90. As described in more detail below, second reflective layer 94, by way of vias 100, provides an electrically conductive path through the first reflective layer 92, between a p-contact 110 and the current-spreading layer 90. In some embodiments, the second reflective layer 94 completely fills the holes 98. In other embodiments, the second reflective layer 94 only partially fills the holes 98. When the second reflective layer 94 only partially fills the holes 98, then a barrier layer 102 and a passivation layer 106 may fill the remaining portion of the vias.

The holes 98 can be formed using many known processes such as conventional etching processes or mechanical processes such as microdrilling. The holes 98 can have many different shapes and sizes, with the holes 98 in the embodiment shown having angled or curved side surfaces and a circular cross-section with a diameter of less than 20 µm. In some embodiments, the holes 98 can have a diameter of approximately 8 µm, with others having a diameter down to 1 µm. Adjacent holes 98 can be less than 100 µm apart, with the embodiment shown having a spacing of 30 µm from edge to edge. In still other embodiments, the holes 98 can have a spacing of as small as 10 µm or less. It is understood that the holes 98 (and resulting vias 100) can have cross-section with different shapes such as square, rectangular, oval, hexagon, and pentagon. In other embodiments the holes are not uniform size and shapes, and there can be different or non-uniform spaces between adjacent holes.

In other embodiments, different structures can be used to provide a conductive path between the p-contact 110 and the current-spreading layer 90. Instead of holes 98, an interconnected grid can be formed through the first reflective layer 92, with a conductive material then being deposited in the grid to form the conductive path to the current-spreading layer 90. The grid can take many different forms, with portions of the grid interconnecting at different angles in different embodiments. An electrical signal applied to the grid can spread throughout and along the interconnected portions. It is further understood that in different embodiments a grid can be used in combination with holes, while other embodiments can provide other conductive paths. In some embodiments one or more conductive paths can run outside the LED chip's active layer, such as along a side surface of the LED chip.

The LED chip 80 can also comprise a barrier layer 102 on the second reflective layer 94 to prevent migration of the second reflective layer 94 material, such as Ag, to other layers. Preventing this migration helps the LED chip 80 maintain efficient operation through its lifetime. Accordingly, the barrier layer 102 is also part of the conductive path from the p-contact 110 to the current-spreading layer 90. In some embodiments, the barrier layer 102 is a single layer, and in other embodiments, the barrier layer 102 comprises a plurality of layers. Suitable materials for the barrier layer 102 include but are not limited to sputtered Ti/Pt followed by evaporated Au bulk material or sputtered Ti/Ni followed by a evaporated Ti/Au bulk material.

An active structure hole 104 can be included passing through the adhesion layer 96, the first reflective layer 92, and p-type layer 84 to expose the n-type layer 86. A passivation layer 106 is included on the barrier layer 102 and the side surfaces of the active structure hole 104. The passivation layer 106 protects and provides electrical insulation between the contacts and the layers below as described in more detail below. The passivation layer 106 can comprise many different materials, such as a dielectric material. In some embodiments, the passivation 106 is a single layer, and in other embodiments, the passivation layer 106 comprises a plurality of layers. A suitable material for the passivation layer 106 includes but is not limited to silicon nitride.

Passivation layer hole 108 can be formed through the passivation layer 106 to the barrier layer 102 and/or the second reflective layer 94. The p-contact 110 can then be deposited in the passivation layer hole 108. In operation, an electrical signal applied to the p-contact passes through the barrier layer 102, through the second reflective layer 94 and the vias 100, and to the current-spreading layer 90 through which it is spread to the p-type layer 84. Similarly, an n-contact 112 is formed on the passivation layer 106 and through the active structure hole 104, with the n-contact 112 providing an electrical path for an electrical signal to be applied to the n-type layer 86. In operation, a signal applied across the p-contact 110 and the n-contact 112 is conducted to the p-type layer 84 and the n-type layer 86, causing the LED chip 80 to emit light from its active layer 88.

The p-contact 110 and the n-contact 112 can comprise many different materials such as Au, copper (Cu), nickel (Ni), In, Al, Ag, tin (Sn), Pt, or combinations thereof. In still other embodiments they can comprise conducting oxides and transparent conducting oxides such as ITO, nickel oxide, zinc oxide, cadmium tin oxide, indium oxide, tin oxide, magnesium oxide, $ZnGa_2O_4$, $ZnO_2$/Sb, $Ga_2O_3$/Sn, $AgInO_2$/Sn, $In_2O_3$/Zn, $CuAlO_2$, LaCuOS, $CuGaO_2$, and $SrCu_2O_2$. The choice of material used can depend on the location of the contacts and on the desired electrical characteristics, such as transparency, junction resistivity, and sheet resistance.

As described above, the LED chip 80 is arranged for flip-chip mounting. In operation, the p-contact 110 and n-contact 112 are bonded to a surface, such as a printed circuit board, with electrical paths for applying an electrical signal to the LED chip 80. In most cases, the p-contact 110 and n-contact 112 are on the bottom surface, and light that is emitted toward the bottom of the LED chip risks being at least partially absorbed, such as by the printed circuit board. The first reflective layer 92 and the second reflective layer 94 are arranged below the active layer 88 so that light emitted toward the bottom is reflected back up to contribute to useful LED chip emission. The first reflective layer 92 reflects most light by TIR, with the majority of the remainder of the light being reflected by the second reflective layer 94.

Figure 9:
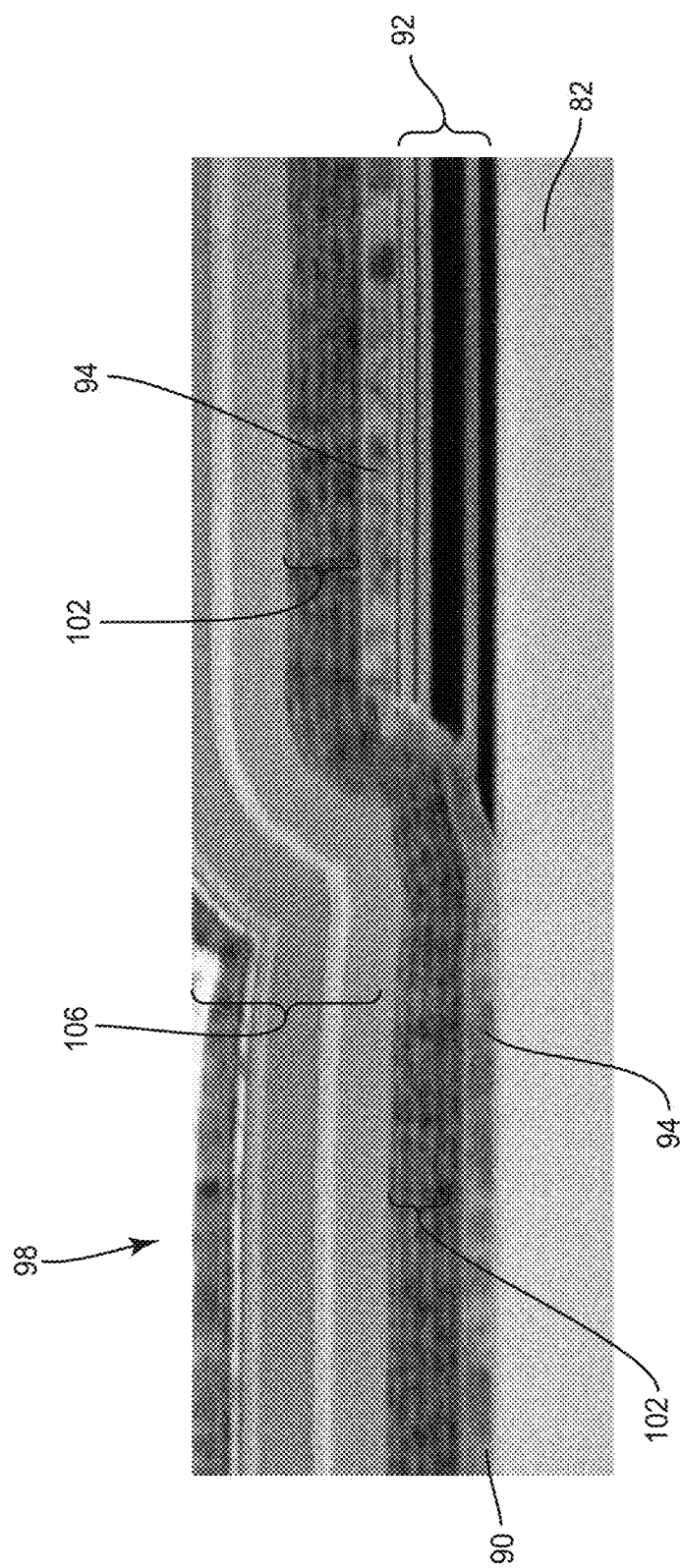
FIG. 9 is a microscopic cross-sectional image of a portion of an LED according to some embodiments.

As described above, the actual thickness of the layers can be different, and variations from the shapes of the illustrations as a result, for example, of manufacturing techniques and/or tolerances, are expected. A region illustrated or described as square or rectangular can have rounded or curved features, and regions shown as straight lines may have some irregularity. For example, FIG. 9 is a microscopic cross-sectional image of a portion of an LED chip according to some embodiments, such as FIG. 8. In FIG. 9, the active LED structure 82, current-spreading layer 90, first reflective layer 92, hole 98, second reflective layer 94, barrier layer 102, and passivation layer 106 are visible. As shown in the image, the second reflective layer 94, barrier layer 102, and passivation layer 106 are on the first reflective layer 92 and are conformal to the first reflective layer 92 through the hole. The second reflective layer 94 partially fills the hole 98 with the remaining portion of the hole 98 filled by the barrier layer 102 and the passivation layer 106.

Accordingly, some embodiments disclosed herein include an LED chip comprising an active LED structure comprising an active layer between an n-type layer and a p-type layer; a first reflective layer adjacent the active LED structure and comprising a plurality of dielectric layers; a second reflective layer on the first reflective layer; a barrier layer on the second reflective layer; and a passivation layer on the barrier layer.

Figure 10A:
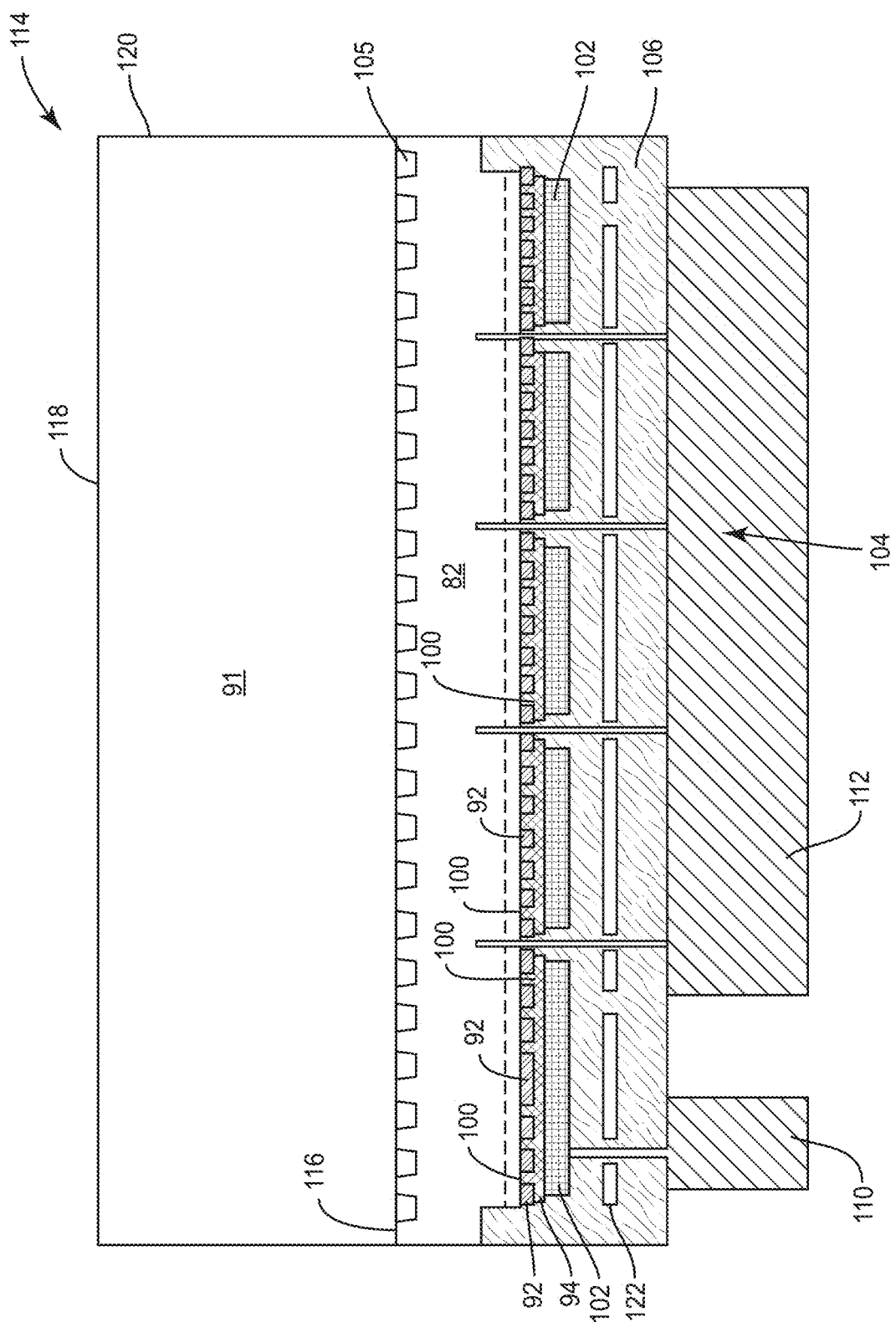
FIG. 10A is a cross-sectional illustration of an LED according to some embodiments.

FIG. 10A illustrates an LED chip 114 similar to the embodiments described above for FIG. 8. In FIG. 10A, the LED chip 114 is in a flip-chip orientation and includes an active LED structure 82, a substrate 91, a first reflective layer 92, a second reflective layer 94, a barrier layer 102, a passivation layer 106, vias 100, active structure holes 104, a p-contact 110, and an n-contact 112 similar to those described in FIG. 8. The substrate 91 is light transmissive (preferably transparent) and includes an outer major surface 118, side surfaces 120, and an internal surface 116. The internal surface 116 is proximate the active LED structure 82 and includes a patterned surface 105 adjacent the active LED structure 82 having multiple recessed and/or raised features. In some embodiments, the patterned surface 105 is adjacent an n-layer of the active LED structure 82. A patterned surface 105 is particularly useful in embodiments in which the substrate 91 comprises sapphire in order to promote extraction of light through the interface between the active LED structure 82 and the substrate 91. In some embodiments, the passivation layer 106 includes a metal-containing interlayer 122 arranged therein, wherein the interlayer 122 may comprise Al or another suitable metal. Notably, the interlayer 122 is embedded within passivation layer 106 and is electrically isolated from the rest of the LED chip 114. In application, the interlayer 122 may function as a crack stop layer for any cracks that may propagate through the passivation layer. Additionally, the interlayer 122 may reflect at least some light that may pass through both the first reflective layer 92 and the second reflective layer 94.

Figure 10B:
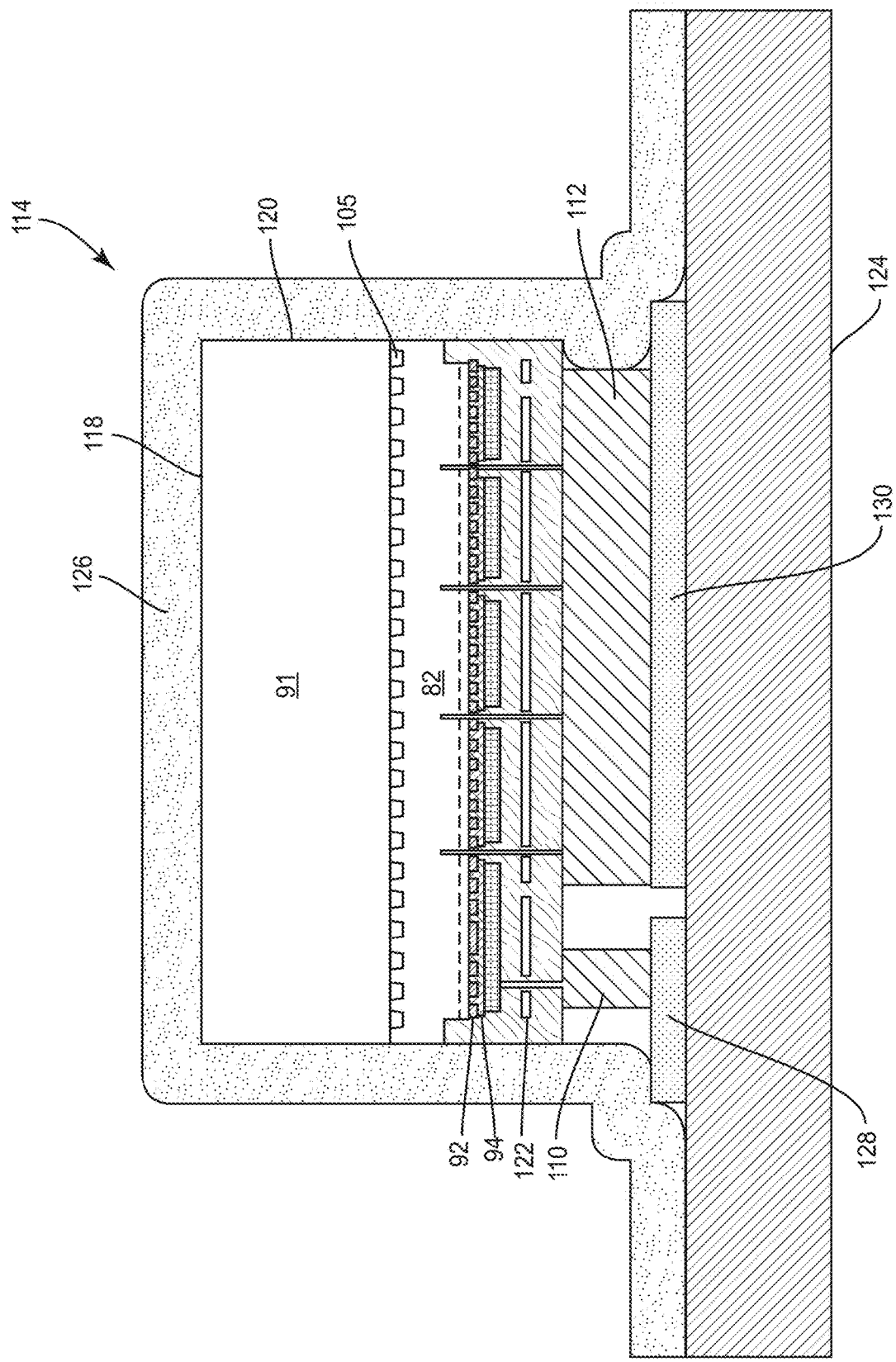
FIG. 10B is a cross-sectional illustration of an LED according to some embodiments.

FIG. 10B illustrates the LED chip 114 of FIG. 10A mounted to a submount 124 and covered with a layer of at least one lumiphoric material 126. The submount 124 includes a first contact pad 128 and a second contact pad 130 arranged proximate to the p-contact 110 and n-contact 112 of the LED chip 114, respectively. Solderless, soldered flux, direct attach, or other conventional attachment means may be used to establish conductive electrical communication between the first contact pad 128 and the p-contact 110 and the second contact pad 130 and the n-contact 112. As illustrated in FIG. 10B, the layer of at least one lumiphoric material 126 is arranged to cover the outer major surface 118, side surfaces 120, and at least a portion of the submount 124.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (LuAg:Ce), and red phosphor ($Ca_{1-x-y}Sr_xEu_yAlSiN_3$) and combinations thereof.

One or more lumiphoric materials may be provided on one or more portions of a flip-chip LED and/or a submount in various configurations. In certain embodiments, one or more surfaces of flip-chip LEDs may be conformally coated with one or more lumiphoric materials, while other surfaces of such LEDs and/or associated submounts may be devoid of lumiphoric material. In certain embodiments, a top surface of a flip-chip LED may include lumiphoric material, while one or more side surfaces of a flip-chip LED may be devoid of lumiphoric material. In certain embodiments, all or substantially all outer surfaces of a flip-chip LED (e.g., other than contact-defining or mounting surfaces) are coated or otherwise covered with one or more lumiphoric materials. In certain embodiments, one or more lumiphoric materials may be arranged on or over one or more surfaces of a flip-chip LED in a substantially uniform manner; in other embodiments, one or more lumiphoric materials may be arranged on or over one or more surfaces of a flip-chip LED in a manner that is non-uniform with respect to one or more of material composition, concentration, and thickness. In certain embodiments, the loading percentage of one or more lumiphoric materials may be varied on or among one or more outer surfaces of a flip-chip LED. In certain embodiments, one or more lumiphoric materials may be patterned on portions of one or more surfaces of a flip-chip LED to include one or more stripes, dots, curves, or polygonal shapes. In certain embodiments, multiple lumiphoric materials may be arranged in different discrete regions or discrete layers on or over a flip-chip LED.

In certain embodiments, a lumiphoric material may be arranged over a light-transmissive surface of the substrate, and the substrate may comprise a thickness of at least 120 μm, at least 150 μm, at least 170 μm, at least 200 μm, at least 230 μm, at least 250 μm (with the preceding minimum thickness values optionally bounded at the upper end by any of the foregoing thickness values), or another thickness threshold specified herein. Without intending to be limited by any specific theory of operation, it is currently believed that providing a relatively thick substrate according to one or more of the preceding thickness thresholds may enhance conversion efficiency of a lumiphor-converted flip-chip LED due to one or more of the following phenomena: (i) increasing physical separation (distance) between an outer major (e.g., top) surface of a substrate and the multi-layer mirror, and (ii) reducing luminous flux on lumiphoric material arranged on or over an outer surface of the substrate.

Benefits of reduced optical losses may be more pronounced and significant with larger LED die sizes (e.g., with substrate widths of at least about 1.2 mm, at least about 1.4 mm, at least about 2 mm, or larger). Larger die have a greater dependency on internal reflectivity due to more interaction of light with the internal reflector layers before the light escapes the LED. Benefits of reduced optical losses may also be more pronounced in producing warm white (versus cool white) emitters, since warm white emitters typically involve a greater amount of back reflection into a LED chip (e.g., due to conversion by multiple phosphor materials or material layers, such as a yellow layer and a red layer). As described above, the first reflective layer 92 includes improved reflectivity across a wide wavelength range and across a wide angle of incidence range and is therefore additionally well suited for larger LED die and/or LED die with multiple lumiphors that convert light from the active LED structure 82 to multiple other colors. Additionally, the first reflective layer 92 in combination with any or all of the second reflective layer 94, the interlayer 122, the patterned surface 105, and the light transmissive or transparent substrate 91 reduces optical losses within the LED chip 114 providing an increase in brightness or luminous flux.

Figure 11A:
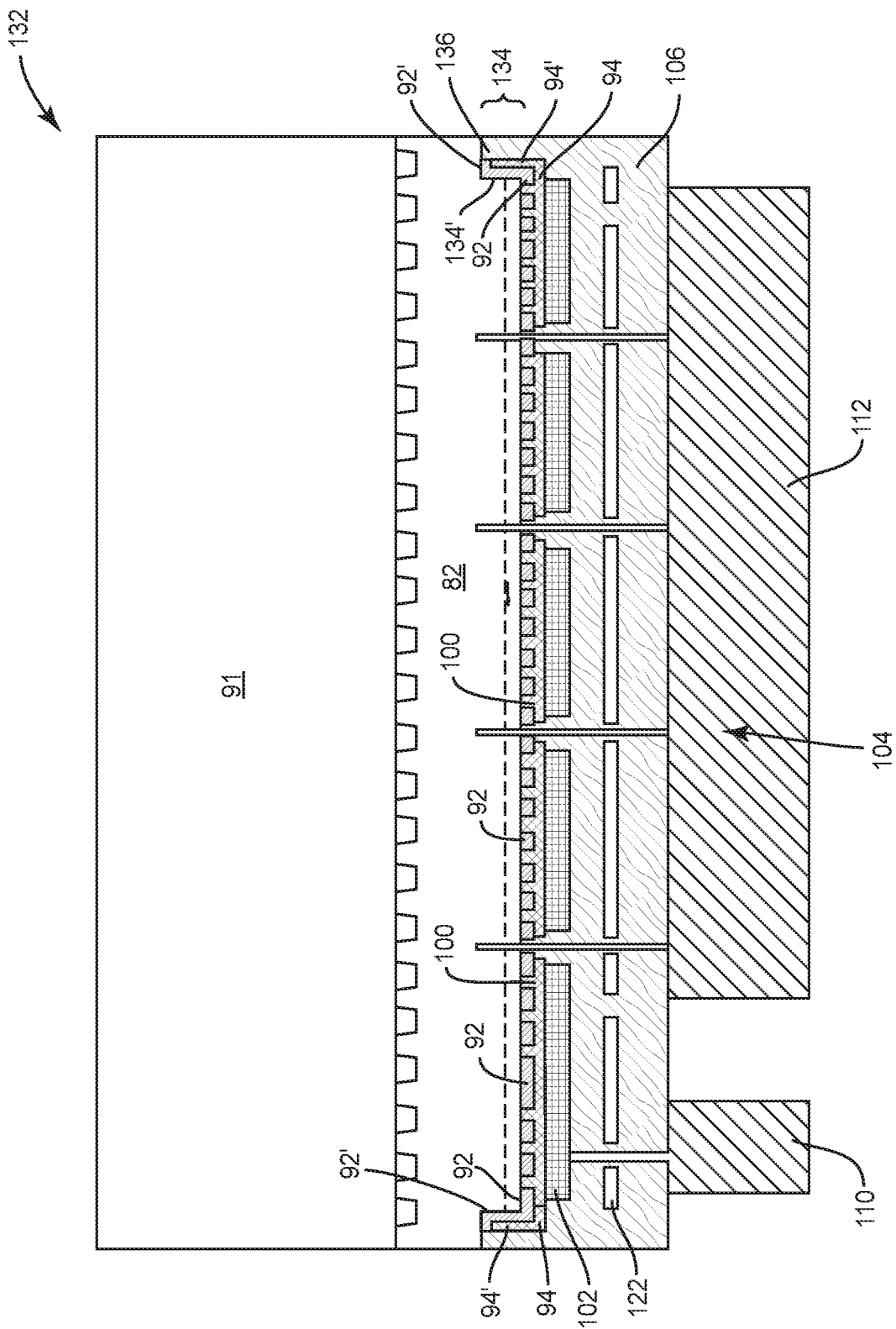
FIG. 11A is a cross-sectional illustration of an LED according to some embodiments.

FIG. 11A illustrates an LED chip 132 according other embodiments. In FIG. 11A, an active LED structure 82, a substrate 91, a first reflective layer 92, a second reflective layer 94, a barrier layer 102, a passivation layer 106, vias 100, active structure holes 104, a p-contact 110, and an n-contact 112 are similar to those described in FIG. 10A. Additionally, the first reflective layer 92 and the second reflective layer 94 include portions that are proximate to the active LED structure 82 and "wraparound" peripheral portions of the the active LED structure 82 (including the n-type layer, active layer, and p-type layer). As shown in FIG. 11A, the active LED structure 82 extends away from the substrate 91 and forms a mesa 134 with a mesa sidewall 134' that is laterally bounded by at least one recess 136 at the periphery of the LED chip 132. The at least one recess 136 includes a peripheral wraparound portion 92' of the first reflective layer 92 that bounds peripheral portions of the active LED structure 82 forming the mesa 134. Additionally, the at least one recess 136 includes a peripheral wraparound portion 94' of the second reflective layer 94 that is arranged in contact with a portion of a wraparound portion 92' of the first reflective layer 92. Within the at least one recess 136, the wraparound portion 92' and peripheral wraparound portion 94' are peripherally bounded by passivation material of the passivation layer 106. Accordingly, the active LED structure 82 comprise a mesa sidewall 134' and the first reflective layer 92 extends along the mesa sidewall 134'.

As with previous embodiments, the first reflective layer 92 may comprise a plurality of first and second dielectric layers with different materials, such as silicon dioxide and silicon nitride, and the wraparound portion 92' would therefore also comprise silicon dioxide and silicon nitride. Accordingly, the peripheral portions of the LED active structure 82 have improved reflectivity and more light may be redirected toward the substrate 91 and out of the LED chip 132. The presence of silicon nitride in the wraparound portion 92' of the first reflective layer 92 serves to provide passivation to the side of the mesa 134 of active LED structure 82. In particular, the presence of silicon nitride in the wraparound portion 92' may serve to protect the active LED structure 82 from migration of metals, such as silver, from the second reflective layer 94. Any metal migrating along the mesa 134 edge may contact both the n-layer and the p-layer of the active LED structure 82 and provide an electrical short that would cause failure of operation of the LED chip 132. Additionally, the presence of silicon nitride in the passivation layer 106 within the recess 136 may serve to block potential paths for moisture to be drawn into contact with metal-containing portions of the second reflective layer 94, which would be expected to lead to detrimental chemical interaction. Accordingly, the LED chip 132 is expected to have improved lumen maintenance, or less light loss over time, in all operating conditions.

Figure 11B:
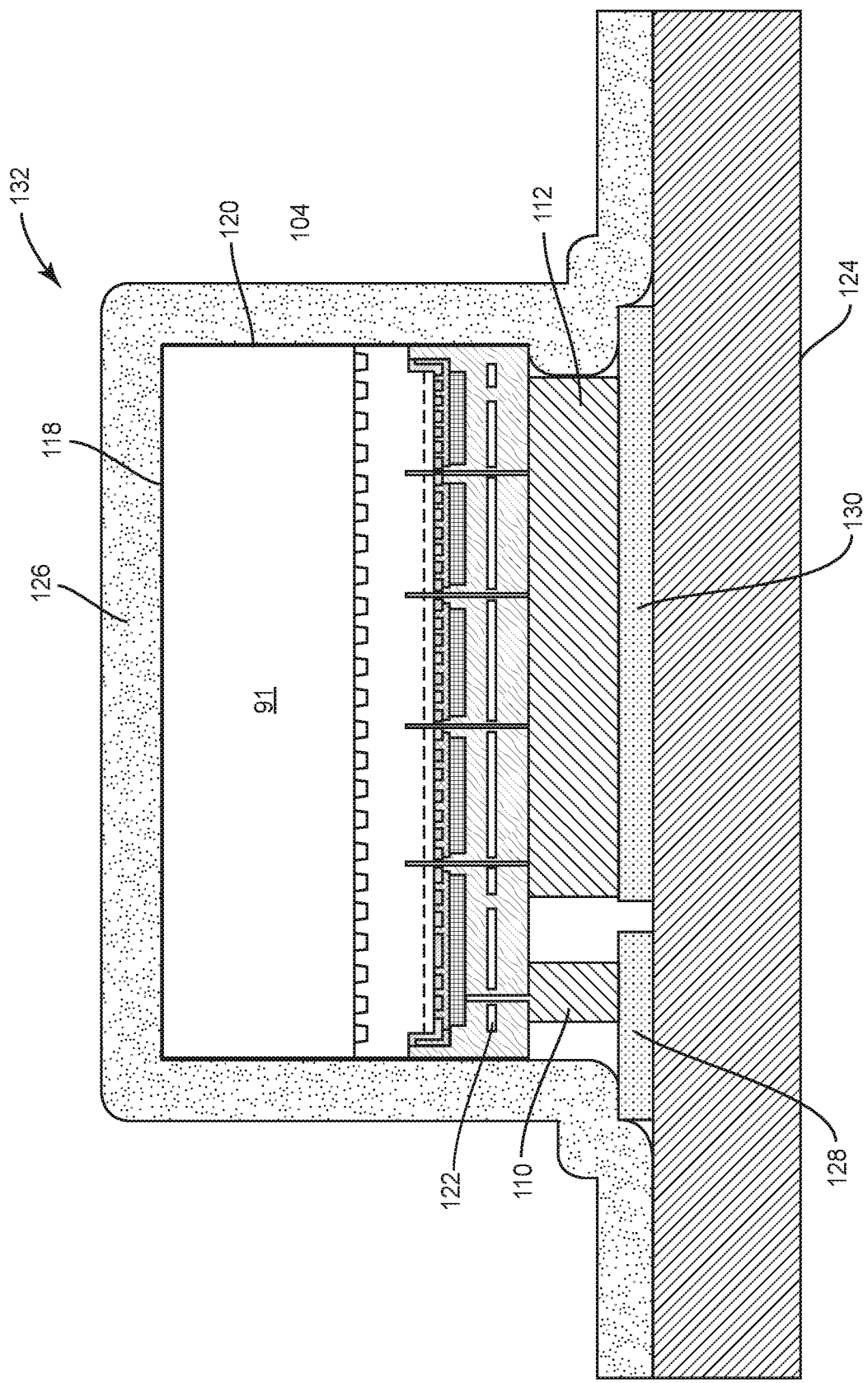
FIG. 11B is a cross-sectional illustration of an LED according to some embodiments.

FIG. 11B illustrates the LED chip 132 of FIG. 11A mounted to a submount 124 and covered with a layer of at least one lumiphoric material 126 similar to that of FIG. 10B. The submount 124 includes a first contact pad 128 and a second contact pad 130 arranged proximate to the p-contact 110 and n-contact 112, respectively. Solderless, soldered flux, direct attach, or other conventional attachment means may be used to establish conductive electrical communication between the first contact pad 128 and the p-contact 110 and the second contact pad 130 and the n-contact 112. As illustrated in FIG. 11B, the layer of at least one lumiphoric material 126 is arranged to cover an outer major surface 118 of the substrate 91 and one or more side surfaces 120 of the substrate 91 as well as the at least a portion of the submount 124.

Figure 12A:
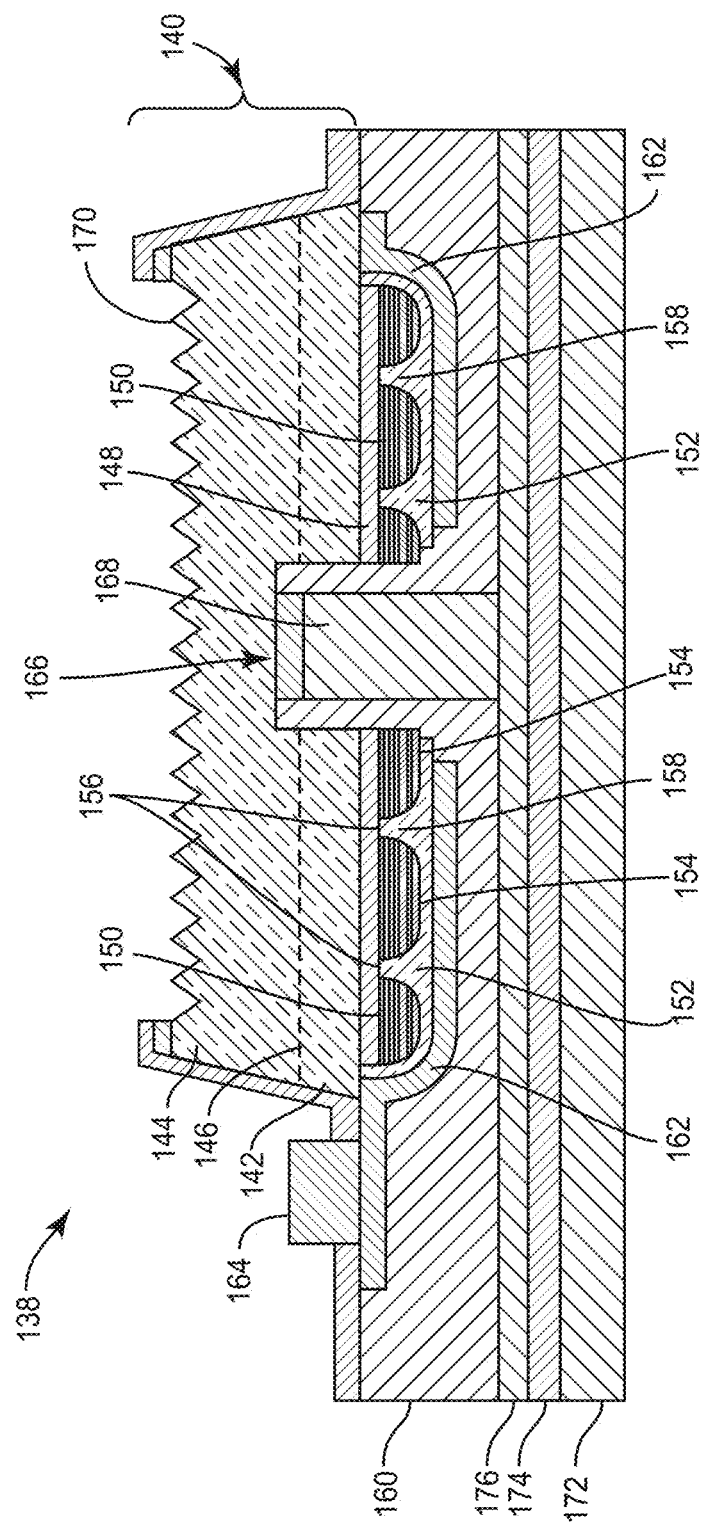
FIG. 12A is a cross-sectional illustration of an LED according to some embodiments.

FIG. 12A illustrates another embodiment of a LED chip 138 according to the present invention that is flip-chip mounted onto a submount or substrate for use. The LED chip has many layers similar to those in the embodiment shown in FIG. 8, FIG. 10A, and FIG. 10B and described above, including an active LED structure 140 comprising an p-type layer 142, n-type layer 144, and an active layer 146. A current-spreading layer 148 is included on the p-type layer 142 to spread current to the p-type layer 142 during operation. A first reflective layer 150 is included on the current-spreading layer 148, and a second reflective layer 152 is included on the first reflective layer 150 with an adhesion layer 154 between the two.

The first reflective layer 150 is arranged on the current-spreading layer 148 and adjacent the p-type layer 142 and can have any of the embodiments with a plurality of layers previously described for the first reflective layer 56 as described for FIG. 5B or the first reflective layer 92 as described for FIG. 8. For example, in LED chip 138, the first reflective layer 150 may comprise a plurality of dielectric layers. The plurality of dielectric layers may comprise embodiments in which each dielectric layer of the plurality of dielectric layers comprises a different thickness. In some embodiments, the first reflective layer 150 comprises from 7 to 13 dielectric layers. In some embodiments, the first reflective layer 150 comprises a plurality of alternating first dielectric layers and second dielectric layers. The plurality first dielectric layers may have a different index of refraction than the plurality of second dielectric layers. In further embodiments, the plurality of first dielectric layers comprises silicon dioxide and the plurality of second dielectric layers comprises silicon nitride, although other material combinations are possible as described above. In some embodiments, the first reflective layer 150 comprises an uneven number of first dielectric layers and second dielectric layers, while in other embodiments, the first reflective layer 150 comprises an even number of first dielectric layers and of second dielectric layers. In some embodiments, the first reflective layer 150 comprises an aperiodic Bragg reflector. In some embodiments, the first reflective layer 150 comprises a plurality of dielectric layers in which the thickest dielectric layer of the plurality of dielectric layers is spaced from the active layer by at least one thinner dielectric layer. In some embodiments, the first reflective layer 150 comprises a plurality of first dielectric layers having an average thickness that is greater than an average thickness of a plurality of second dielectric layers, and at least one layer of the plurality of second dielectric layers has a thickness greater than at least one layer of the plurality of first dielectric layers. All other embodiments described for the first reflective layer 56 of FIG. 5 and the first reflective layer 92 of FIG. 8 are also applicable to the first reflective layer 150 of FIG. 12A.

The LED chip 138 further comprises reflective layer holes 156 that can pass through the adhesion layer 154 and the first reflective layer 150 to the current-spreading layer 148. The reflective layer holes 156 can then be filled or partially filled when the second reflective layer 152 is deposited. Accordingly, the second reflective layer 152 is formed on the first reflective layer 150 and comprises vias 158 to the current-spreading layer 148 as previously described for FIG. 8.

In FIG. 12A, a passivation layer 160 and a barrier layer 162 extend beyond the edge of the active LED structure 140 where a p-contact 164 can be formed on the barrier layer 162. It is understood that the passivation layer 160 may include a metal interlayer as described in FIG. 10A. An active structure hole 166 is included through the adhesion layer 154, the first reflective layer 150, the current-spreading layer 148, the p-type layer 142, and the active layer 146. The passivation layer 160 is included on the barrier layer 162 and the side surfaces of the active structure hole 166, and an n-contact via or n-contact 168 is included in the active structure hole 166 for applying an electrical signal to the n-type layer 144. An electrical signal applied to the p-contact 164 is conducted to the p-type layer 142 through the barrier layer 162, the second reflective layer 152, and the current-spreading layer 148. Accordingly, an electrical signal applied across the p-contact 164 and the n-contact 168 is conducted to the p-type layer 142 and the n-type layer 144, causing the active layer 146 to emit light.

In FIG. 12A, the growth substrate for LED chip 138 has been removed, and the top surface 170 of the n-type layer 144 is textured for light extraction. To provide mechanical stabilization, the LED chip 138 is flip-chip mounted to a submount 172, with a bond metal layer 174 and blanket mirror layer 176 between the submount 172 and the active LED structure 140. Accordingly, the p-type layer 142 is between the submount 172 and the active layer 146. The submount 172 can be made of many different materials, with a suitable material being silicon. The blanket mirror layer 176 can be made of many different materials, with a suitable material being Al. The blanket mirror layer 176 helps to reflect LED light that escapes reflection by the first reflective layer 150 and the second reflective layer 152, such as light that may passes through the active structure hole 166. In some embodiments, the first reflective layer 150 may wrap around and extend on the side of the active LED structure 140 within the active structure hole 166.

Figure 12B:
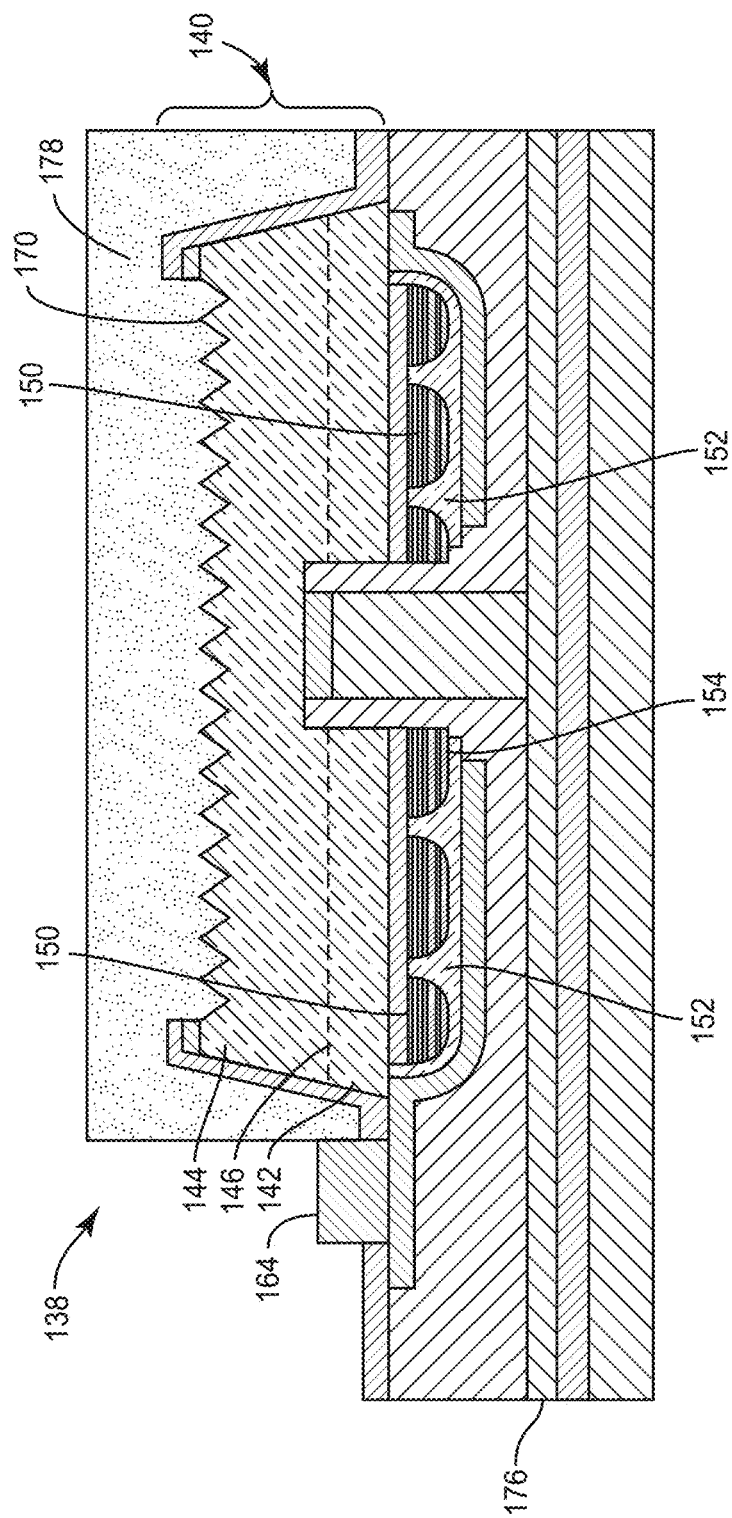
FIG. 12B is a cross-sectional illustration of an LED according to some embodiments.

FIG. 12B illustrates the LED chip 138 of FIG. 12A covered with a layer of at least one lumiphoric material 178. The lumiphoric material 178 may be any material or combination of materials as described for the layer of at least one lumiphoric material 126 of FIG. 10B. In FIG. 12B, the layer of at least one lumiphoric material 178 may be deposited on top of active LED structure 140 while leaving the p-contact 164 exposed. As with the embodiments of FIG. 12A, the active LED structure 140 includes an n-type layer 144, an active layer 146, and a p-type layer 142 In some embodiments, the layer of at least one lumiphoric material 178 is on the n-type layer 144. As described above, the first reflective layer 92 includes improved reflectivity across a wide wavelength range and across a wide angle of incidence range. In operation, light of various wavelengths is emitted omnidirectionally from the active layer 146 and/or converted omnidirectionally by the layer of at least one lumiphoric material 178 and may be reflected by the first reflective layer 150, the second reflective layer 152 or the blanket mirror layer 176 and extracted from the textured top surface 170. Accordingly, the first reflective layer 150 in combination with any or all of the second reflective layer 152, the blanket mirror layer 176, and the textured top surface 170 reduces optical losses within the LED chip 138, providing an increase in brightness or luminous flux.

Figure 13:
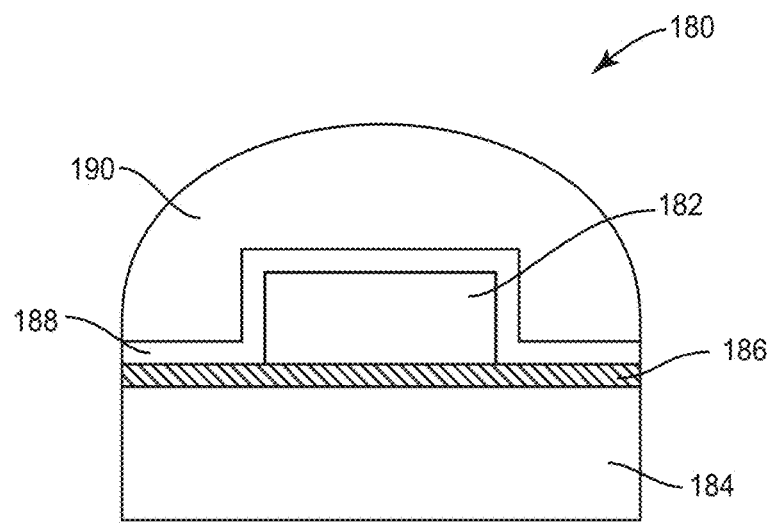
FIG. 13 is a cross-sectional representation of a packaged LED according to some embodiments.

In addition to the LED chip embodiments previously described, reflective layers described herein may also provide reflectivity improvements in other configurations. For example, FIG. 13 is a cross-sectional representation of a packaged LED 180 according to some embodiments. In FIG. 13, at least one light source 182, such as an LED chip, mounted on a submount 184. The submount 184 may include any number of materials, including but not limited to, alumina, AlN, silicon, and printed circuit boards. In some embodiments, a first reflective layer 186 is on the submount 184 and between the at least one light source 182 and the submount 184. In further embodiments, the first reflective layer 186 extends on the submount 184 beyond where the at least light source 182 is mounted. In other embodiments, the first reflective layer 186 may only be on portions of the submount 184 in areas outside of where the at least one light source 182 is mounted. The packaged LED 180 may further include a lumiphoric layer 188 and an encapsulant 190. The lumiphoric layer 188 may include any of the lumiphoric materials previously described, for example as described for FIG. 10A, and the encapsulant 190 may include an optically transmissive material such as silicone or glass that may be molded in the shape of a lens. In some embodiments, the lumiphoric layer 188 is on the first reflective layer 186 outside of where the at least one light source 182 is mounted. In some embodiments, the lumiphoric layer 188 and the encapsulant 190 may be combined, for example a silicone material acting as a binder for lumiphoric materials. The first reflective layer 186 may be any of the multiple layer reflective combinations as previously described, for example as described for the first reflective layer 56 of FIG. 5B, FIG. 5C, and FIG. 5D. Accordingly, the first reflective layer 186 is in an optical path of the at least one light source 182. For example, light emitted by the at least one light source 182 and light converted by the lumiphoric layer 188 toward the submount 184 may be reflected by the first reflective layer 186 in locations between the at least one light source 182 and the submount 184 as well as locations on the submount 184 outside of where the at least light source 182 182 is mounted.

Figure 14:
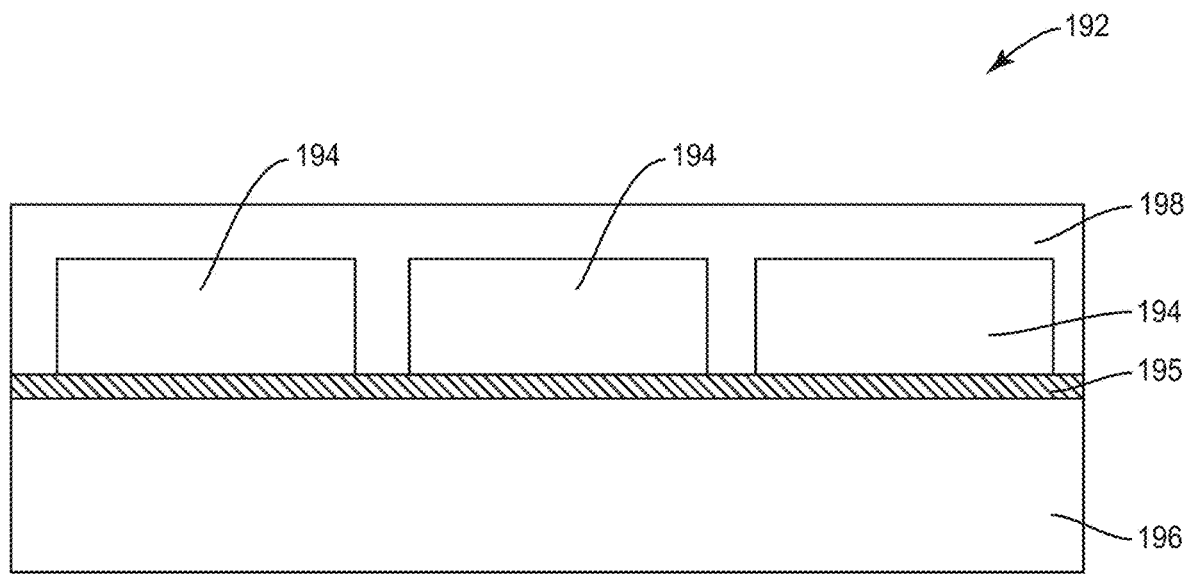
FIG. 14 is a cross-sectional representation of a packaged LED according to some embodiments.

FIG. 14 is a cross-sectional representation of a packaged LED 192 according to some embodiments that is similar to the packaged LED 180 of FIG. 13, but is illustrated with a plurality of light sources 194, such as LED chips. Notably, a first reflective layer 195 is on a submount 196 and is in an optical path of the plurality of light sources 194 and is configured to reflect light emitted by the plurality of light sources 194. The first reflective layer 195 may be any of the multiple layer reflective combinations as previously described, for example as described for the first reflective layer 56 of FIG. 5B, FIG. 5C, and FIG. 5D. An encapsulant 198 may be provided over the plurality of LED chips 194 and may comprise many shapes, for example but not limited to, a square or rectangular cubic shape, a hemispherical-shaped lens, or a hemispherical-shaped lens with planar side surfaces. In some embodiments, the encapsulant may be dispensed on the submount 196 inside of a retention material (not shown) that surrounds the plurality of light sources 194.

Figure 15:
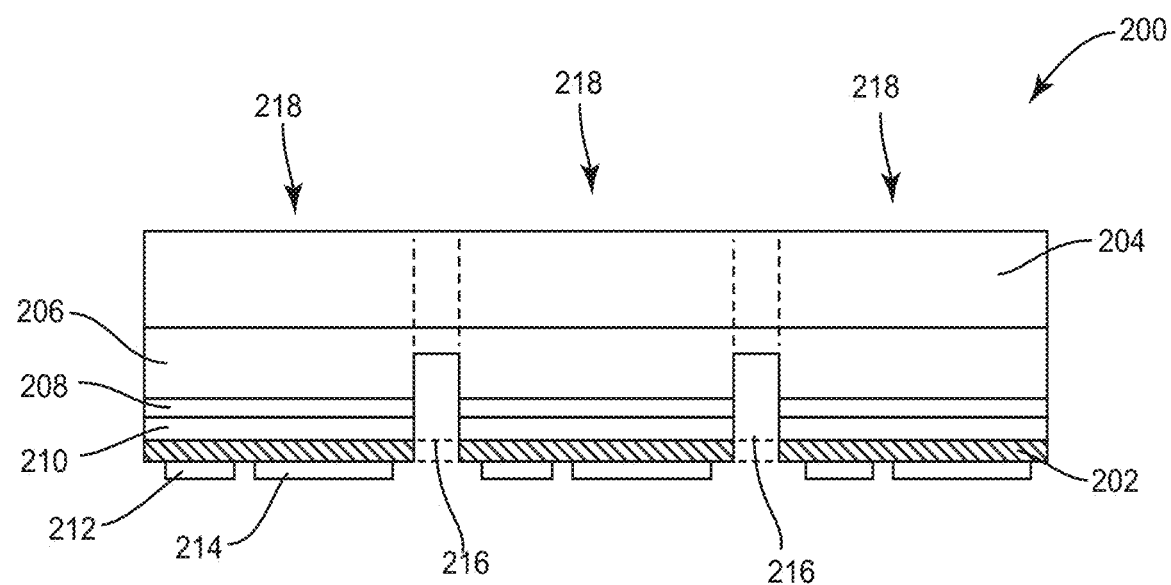
FIG. 15 is a cross-sectional representation of a multiple-junction LED chip according to some embodiments.

FIG. 15 is a cross-sectional representation of a multiple-junction LED chip 200 according to some embodiments. The multiple-junction LED chip 200 includes a substrate 204, at least one n-type layer 206, at least one active layer 208, and at least one p-type layer 210. Individual junctions 218 are provided by isolation trenches 216 that extend through the at least one p-type layer 210 and the at least one active layer 208 to the at least one n-type layer 206. In some embodiments, the isolation trenches 216 extend to the substrate 204. In some embodiments, the isolation trenches 216 extend completely through the substrate 204 as illustrated by the vertical dashed lines in FIG. 15. In embodiments where the substrate 204 is removed, the isolation trenches 216 may extend through the at least one n-type layer 206. Individual junctions 218 are individually addressable by way of a separate first contact 212 and a separate second contact 214 for each of the individual junctions 218. For example, the multiple-junction LED chip 200 may be mounted on a submount (not shown) that includes corresponding electrical connections for the first contact 212 and the second contact 214. The submount may be a printed circuit board with electrical traces or any other type of submount with corresponding electrical connections. The multiple-junction LED chip 200 further includes a first reflective layer 202 that may be on the at least one p-type layer 210 of the individual junctions 218. The first reflective layer 202 may be any of the multiple layer reflective combinations as previously described, for example as described for the first reflective layer 56 of FIG. 5B, FIG. 5C, and FIG. 5D. The first reflective layer 202 is in an optical path of the multiple-junction LED chip 200. The multiple-junction LED chip 200 may be a flip-chip LED similar to the embodiments previously described for FIG. 8, FIG. 10A, FIG. 10B, FIG. 11A, and FIG. 11B. In other embodiments, the multiple-junction LED chip 200 may be similar to the embodiment previously described for FIG. 12A and FIG. 12B. The first reflective layer 202 may be on each of the individual junctions 218 and the isolation trenches 216 may extend through the first reflective layer. In other embodiments, the first reflective layer 202 may be a continuous layer across all of the individual junctions 218 as shown by the horizontal dashed lines in FIG. 15. For example, the isolation trenches 216 may be formed from the substrate or the at least one n-type layer 206 toward but not through the first reflective layer 202.

Figure 16:
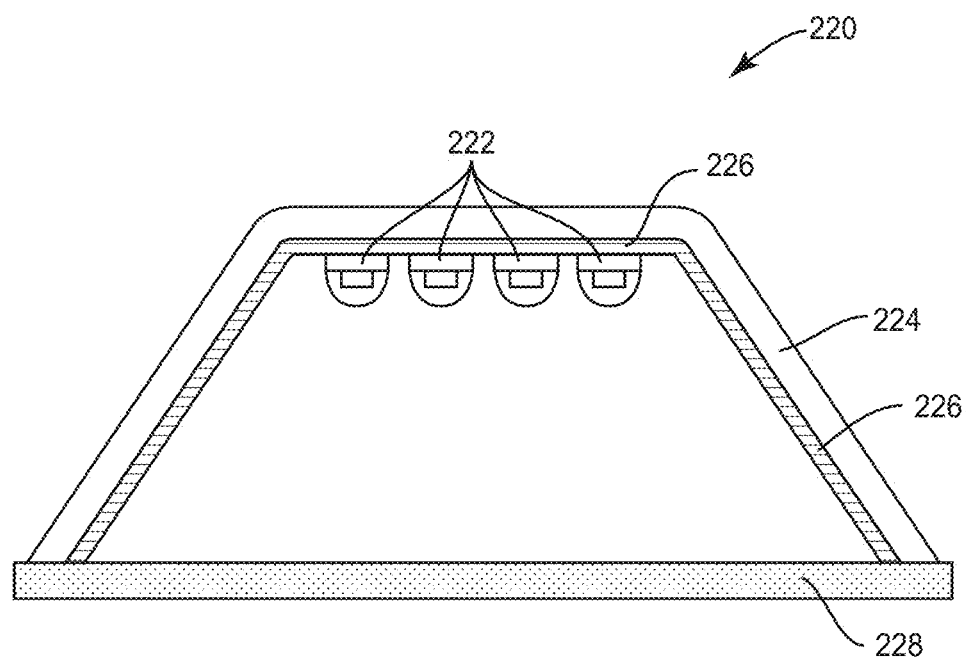
FIG. 16 is a cross-sectional representation of a portion of a lighting fixture according to some embodiments.

In other embodiments, reflective layers described herein may also provide reflectivity improvements in system level configurations. For example, FIG. 16 is a cross-sectional representation of a portion of a lighting fixture 220 according to some embodiments. In FIG. 16, a lighting fixture 220 includes a light source 222. The light source 222 may be a single light source or a plurality of light sources and may include a packaged LED, a semiconductor-based LED chip, an organic LED chip, a laser, a fluorescent light source, and an incandescent light source among others. The light source 222 is mounted or supported to a housing 224 of the light fixture 220. A first reflective layer 226 is on the housing and may be located between the light source 222 and the housing 224 as well as in locations outside of where the light source 222 is supported by the housing 224. In some embodiments, the first reflective layer 226 is only in locations outside of where the light source 222 is supported by the housing 224. The first reflective layer 226 may be any of the multiple layer reflective combinations as previously described, for example as described for the first reflective layer 56 of FIG.

5B, FIG. 5C, and FIG. 5D. The lighting fixture 220 may further include a light-transmissive cover 228. Accordingly, the first reflective layer 226 is in an optical path of the light source 222. For example, light emitted by the light source 222 may be reflected by the first reflective layer 226 on the housing 224 before exiting the lighting fixture 220 through the light-transmissive cover 228.

Accordingly, some embodiments described herein include a device comprising a light source and a first reflective layer in an optical path of the light source. The first reflective layer comprises a plurality of first dielectric layers and a plurality of second dielectric layers and an average thickness of the plurality of first dielectric layers is greater than an average thickness of the plurality second dielectric layers. At least one layer of the plurality of second dielectric layers comprises a thickness greater than at least one layer of the plurality of first dielectric layers. Additionally, the reflective layer may comprise any of the embodiments described above for FIG. 5B, FIG. 5C, and FIG. 5D.

Other embodiments described herein include a device comprising a light source and a first reflective layer in an optical path of the light source. The first reflective layer comprises a plurality of first dielectric layers and a plurality of second dielectric layers wherein each layer of the plurality of first dielectric layers comprises a different thickness. A thickest layer of the plurality of first dielectric layers is between other layers of the plurality of first dielectric layers.

Additionally, the reflective layer may comprise any of the embodiments described above for FIG. 5B, FIG. 5C, and FIG. 5D.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip comprising:
   an active LED structure comprising an active layer between an n-type layer and a p-type layer;
   a first reflective layer adjacent the active LED structure and comprising a plurality of dielectric layers that forms an aperiodic Bragg reflector;
   a second reflective layer on the first reflective layer;
   a barrier layer on the second reflective layer;
   a passivation layer on the barrier layer; and
   a metal-containing interlayer embedded within the passivation layer, wherein the metal-containing interlayer is electrically isolated from the active LED structure.

2. The LED chip of claim 1 wherein each dielectric layer of the plurality of dielectric layers comprises a different thickness.

3. The LED chip of claim 1 wherein the plurality of dielectric layers comprises from 7 to 13 dielectric layers.

4. The LED chip of claim 2 wherein a thickest dielectric layer of the plurality of dielectric layers is spaced from the active LED structure by at least one thinner dielectric layer.

5. The LED chip of claim 2 wherein the plurality of dielectric layers comprises alternating first dielectric layers and second dielectric layers.

6. The LED chip of claim 5 wherein the plurality of dielectric layers comprises an uneven number of first dielectric layers and an even number of second dielectric layers.

7. The LED chip of claim 5 wherein the first dielectric layers comprise silicon dioxide and the second dielectric layers comprise silicon nitride.

8. The LED chip of claim 1 wherein the second reflective layer comprises an electrically conductive material.

9. The LED chip of claim 8 wherein the second reflective layer comprises an electrically conductive path through the first reflective layer.

10. The LED chip of claim 1 further comprising a current-spreading layer between the active LED structure and the first reflective layer.

11. The LED chip of claim 10 wherein the current-spreading layer comprises indium tin oxide.

12. The LED chip of claim 1 further comprising an adhesion layer between the first reflective layer and the second reflective layer.

13. The LED chip of claim 1 further comprising a substrate wherein the n-type layer is between the substrate and the active layer.

14. The LED chip of claim 13 wherein the substrate comprises a patterned surface adjacent the n-type layer.

15. The LED chip of claim 13 further comprising a lumiphoric layer on the substrate.

16. The LED chip of claim 1 wherein the active LED structure comprises a mesa sidewall and the first reflective layer extends along the mesa sidewall.

17. The LED chip of claim 1 further comprising a submount wherein the p-type layer is between the submount and the active layer.

18. The LED chip of claim 17 further comprising a lumiphoric layer on the n-type layer.

19. A light-emitting diode (LED) chip comprising:
   an active LED structure comprising an active layer between an n-type layer and a p-type layer; and
   a first reflective layer adjacent the active LED structure and comprising a plurality of first dielectric layers that directly alternate with a plurality of second dielectric layers wherein each layer of the plurality of first dielectric layers comprises a different thickness;
   wherein a thickest layer of the plurality of first dielectric layers is between other layers of the plurality of first dielectric layers and a thinnest layer of the plurality of first dielectric layers is arranged farthest away from the active LED structure than other layers of the plurality of first dielectric layers, the thickest layer of the plurality of first dielectric layers being at least four times thicker than any other first dielectric layer of the plurality of first dielectric layers.

20. The LED chip of claim 19 wherein the first reflective layer comprises an uneven number of the plurality of first dielectric layers compared with a number of the plurality of second dielectric layers.

21. The LED chip of claim 19 further comprising a second reflective layer on the first reflective layer.

22. The LED chip of claim 21 wherein the second reflective layer comprises an electrical path through the first reflective layer.

23. The LED chip of claim 19 further comprising a current-spreading layer between the active LED structure and the first reflective layer.

24. The LED chip of claim 23 wherein the current-spreading layer comprises indium tin oxide.

25. The LED chip of claim 21 further comprising an adhesion layer between the first reflective layer and the second reflective layer.

26. The LED chip of claim 19 wherein the first reflective layer is adjacent the p-type layer.

27. The LED chip of claim 19 wherein the active LED structure comprises a mesa sidewall and the first reflective layer extends along the mesa sidewall.

28. The LED chip of claim 1 wherein the passivation layer comprises silicon nitride.

29. The LED chip of claim 1 wherein the passivation layer comprises silicon nitride and the metal-containing interlayer comprises aluminum.

30. The LED chip of claim 1 wherein the metal-containing interlayer is electrically isolated from other portions of the LED chip by the passivation layer.

31. A light-emitting diode (LED) chip comprising:
- an active LED structure comprising an active layer between an n-type layer and a p-type layer;
- a first reflective layer adjacent the active LED structure and comprising a plurality of first dielectric layers and a plurality of second dielectric layers, wherein each layer of the plurality of first dielectric layers comprises a different thickness; and
- a second reflective layer adjacent the first reflective layer such that the first reflective layer is between the active LED structure and the second reflective layer;
- wherein a thickest layer of the plurality of first dielectric layers is between other layers of the plurality of first dielectric layers, and the thickest layer of the plurality of first dielectric layers is at least four times thicker than any other first dielectric layer of the plurality of first dielectric layers that is between the thickest layer of the plurality of first dielectric layers and the second reflective layer.

32. The LED chip of claim 31 further comprising an adhesion layer between the first reflective layer and the second reflective layer.

* * * * *